(12) United States Patent
Kikuta

(10) Patent No.: US 6,818,991 B1
(45) Date of Patent: Nov. 16, 2004

(54) COPPER-ALLOY INTERCONNECTION LAYER

(75) Inventor: Kuniko Kikuta, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 38 days.

(21) Appl. No.: 09/584,739

(22) Filed: Jun. 1, 2000

(30) Foreign Application Priority Data

Jun. 1, 1999 (JP) .......................................... 11-154099

(51) Int. Cl.$^7$ ............................................. H01L 23/48
(52) U.S. Cl. ....................... 257/751; 257/752; 257/764; 257/766
(58) Field of Search ......................... 257/751, 761–764, 257/766, 767; 420/492

(56) References Cited

U.S. PATENT DOCUMENTS

| | | | | |
|---|---|---|---|---|
| 4,559,200 A | * | 12/1985 | Yamazaki et al. | 420/492 |
| 4,749,548 A | * | 6/1988 | Akutsu et al. | 420/469 |
| 5,004,520 A | * | 4/1991 | Tsuji et al. | 156/630 |
| 5,714,117 A | * | 2/1998 | Berge et al. | 420/587 |
| 5,833,920 A | * | 11/1998 | Nakanishi et al. | 420/477 |
| 5,846,346 A | * | 12/1998 | Lee et al. | 148/433 |
| 6,149,741 A | * | 11/2000 | Durand-Texte | 148/544 |
| 6,181,012 B1 | * | 1/2001 | Edelstein et al. | 257/762 |
| 6,188,134 B1 | * | 2/2001 | Stumborg et al. | 257/751 |
| 6,197,435 B1 | * | 3/2001 | Tsujimura et al. | 428/621 |
| 6,242,808 B1 | * | 6/2001 | Shimizu et al. | 257/762 |
| 6,249,055 B1 | * | 6/2001 | Dubin | 257/758 |
| 6,274,935 B2 | * | 8/2001 | Uzoh | 257/762 |
| 6,320,263 B1 | * | 11/2001 | Lopatin et al. | 257/758 |

FOREIGN PATENT DOCUMENTS

| | | | |
|---|---|---|---|
| JP | 10-189495 | 7/1988 | |
| JP | 63-262437 | * 10/1988 | ............ H01B/1/02 |
| JP | 1-248538 | 10/1989 | |
| JP | 2-143429 | 6/1990 | |
| JP | 3-285035 | * 12/1991 | ............ H01B/1/02 |
| JP | 4-28233 | 1/1992 | |
| JP | 5-267299 | 10/1993 | |
| JP | 7-235538 | 9/1995 | |
| JP | 9-20942 | 1/1997 | |
| JP | 11-45887 | 2/1999 | |
| JP | 11-204524 | 7/1999 | |
| JP | 11-204644 | 7/1999 | |
| JP | 11-340229 | 12/1999 | |
| JP | 2000-049229 | 2/2000 | |

OTHER PUBLICATIONS

Japanese Office Action dated Dec. 3, 2002 with partial English translation.
Japanese Office Action dated Nov. 20, 2001 with partial English Translation.

* cited by examiner

Primary Examiner—T. N. Quach
(74) Attorney, Agent, or Firm—McGinn & Gibb, PLLC

(57) ABSTRACT

The present invention provides an electrically conductive layer comprising a copper alloy which includes at least one of Ag, As, Bi, P, Sb, Si, and Ti in the range of not less than 0.1 percent by weight to not more than a maximum solubility limit to copper, so that the copper alloy is in a solid solution and/or which includes at least one of Mo, Ta and W in a range of not less than 0.1 percent by weight to not more than 1 percent by weight.

24 Claims, 21 Drawing Sheets

① : a solid phase of Cu.

② : co-existence of a liquid phase of Ag and Cu and a solid phase of Cu.

③ : a liquid phase of Ag and Cu.

④ : co-existence of a liquid phase of Ag and Cu and a solid phase of Ag.

⑤ : a solid phase of Ag.

⑥ : a solid phase of Ag and Cu.

COPPER-ALLOY INTERCONNECTION LAYER

BACKGROUND OF THE INVENTION

The present invention relates to a semiconductor device and a method of forming the same, and more particularly to a copper-alloy interconnection structure formed in an inter-layer insulator in a semiconductor device and a method of forming the same.

In recent years, the degree of integration of semiconductor devices such as LSI has been on the increase in response to the requirements for improvement in functions of electronic devices and for scaling down and reduction in weight as well as improvement in high speed performance. In order to realize the increase in the degree of integration of the semiconductor devices, it is essential to reduce a width of the interconnection. The majority of the conventional interconnection comprises an aluminum interconnection because aluminum is low in electrical resistance and is superior in adhesiveness with a silicon dioxide film as well as superior in formability.

The aluminum interconnection raises serious problems in electromigration, stressmigration, and formation of voids particularly as the width of the aluminum interconnection is reduced for realizing the increase in the degree of integration of the semiconductor devices. In these circumstances, recently, other available materials than aluminum have been investigated as the interconnection materials free from the above problems.

Copper is attractive as the interconnection material reduced in width. Copper is lower in electric resistance than aluminum. Namely, the electric resistance of copper is about two third of the electric resistance of aluminum. For this reason, the copper interconnection allows a higher current density than the aluminum interconnection. Further, copper is higher in melting point than aluminum by not less than 400° C. This means that the copper interconnection is higher in stability to electromigration than the aluminum interconnection. The copper interconnection is, thus, attractive as the interconnection material for the advanced semiconductor device such as LSI.

If, however, the width of the copper interconnection is reduced to about 0.3 micrometers, then an electromigration is caused, and the copper interconnection is made deteriorated due to an electromigration. In order to reduce the electromigration of the copper interconnection having a reduced with of about 0.3 micrometers, it is effective to enlarge crystal grain sizes of copper of the copper interconnection. The enlargement in crystal grain size of copper causes grain boundaries of the crystal grain to be diffused, thereby suppressing movement of copper atoms through the copper interconnection. The suppression of the movement of copper atoms through the copper interconnection means suppression of electromigration. In Japanese laid-open patent publication No. 4-326521, it is disclosed that a copper interconnection has a copper crystal grain size of not less than 1 micrometer. This copper interconnection may be formed by a deposition of a copper film on an insulation film on a semiconductor substrate by either a molecular beam epitaxy or a sputtering method, and subsequent patterning the copper film by a dry etching process. Similar conventional techniques are also disclosed in Japanese laid-open patent publication No. 5-47760 and 10-60633.

In order to realize the reduction in width of the interconnection, it is required to accurately and conveniently form the interconnection. For this purpose, in place of the above method of deposition of the copper film and subsequent patterning the same by a dry etching process, the following method has been proposed. A groove is formed in an insulation film on a semiconductor substrate. A copper film is filled within the groove for subsequent heat treatment to form a copper interconnection in the groove. This conventional method is suitable for forming a fine copper interconnection with a reduced width. It is not so difficult to accurately control the width of the groove in the insulation film. This means it not so difficult to accurately control the width of the copper interconnection in the groove. FIG. 1A is a fragmentary cross sectional elevation view illustrative of a conventional copper interconnection formed in a trench groove in an insulation film over a semiconductor substrate, taken along a plane vertical to a longitudinal direction of the copper interconnection. FIG. 1B is a fragmentary perspective view illustrative of the conventional copper interconnection of FIG. 1A. FIG. 1C is a fragmentary cross sectional elevation view illustrative of the conventional copper interconnection, taken along a B-B' line of FIG 1B, wherein the B-B' line is parallel to the longitudinal direction of the copper interconnection. FIGS. 2A through 2D are fragmentary cross sectional elevation views illustrative of sequential steps involved in a conventional method of forming a copper interconnection formed in a trench groove in an insulation film over a semiconductor substrate, taken along a plane vertical to a longitudinal direction of the copper interconnection.

A copper interconnection 400 comprises a copper layer 41 and a barrier material layer 2. The copper interconnection 400 is formed in a trench groove formed in an inter-layer insulator 10 formed on a semiconductor substrate 0. The barrier metal layer 2 is formed on a bottom and side walls of the trench groove and the copper layer 41 is formed on the barrier metal layer 2 to fill the trench groove. A top surface 400a of the copper film 41 of the copper interconnection 400 is planarized to be leveled to the top surface of the inter-layer insulator 10. The copper interconnection 400 may be formed as follows.

With reference to FIG. 2A, a trench groove 10a is formed in an inter-layer insulator 10 on a semiconductor substrate 0.

With reference to FIG. 2B, a barrier metal layer 2 is entirely formed on the top surface of the inter-layer insulator 10 and on a bottom and side wails of the trench groove 10a.

With reference to FIG. 2C, a copper layer 12 is entirely deposited on the barrier metal layer 2 so that the trench groove 10a is completely filled with the copper layer 12 and also the copper layer 12 exists over the top surface of the inter-layer insulator 10.

With reference to FIG. 2D, a chemical mechanical polishment is carried out to the copper layer 12 and the barrier metal layer 2 so that the copper layer 12 and the barrier metal layer 2 remain only with in the trench groove 10a to form a copper layer 41 within the trench groove 10a. A heat treatment is carried out to the copper layer 41 so as to cause re-arrangement of copper atoms of the copper layer 41, thereby to form a copper interconnection 400 in the trench groove in the inter-layer insulator 10.

As a modification, it is possible that the heat treatment is carried out prior to the chemical mechanical polishment.

This conventional copper interconnection has the following problems. As described above, the trench groove 10a is formed in the inter-layer insulator and then the copper layer is filled within the trench groove prior to the heat treatment to the copper layer for re-arrangement of the copper atoms in the copper layer. If the copper interconnection is required to have a reduced width, it is necessary to form the trench groove with a reduced width corresponding to the required reduced width of the copper interconnection. The narrow width of the trench groove suppress the growth of the copper crystal grain, whereby the copper crystal grain is likely to have a small size. The small size of the crystal grain allows existence of many crystal grain boundaries 43. During the current flow through the copper interconnection, a mass-transfer of copper frequently appears through crystal grain boundaries having the lowest energy, whereby the electromigration frequently appears. This electromigration may cause a disconnection or a crack of the copper interconnection. As a result, the electromigration reduces the reliability of the copper interconnection and the yield of the semiconductor device having the copper interconnection as well as reduces the productivity.

In the above circumstances, it had been required to develop a novel copper interconnection free from the above problem.

SUMMARY OF THE INVENTION

Accordingly, it is an object of the present invention to provide a novel copper-alloy interconnection free from the above problems.

It is a further object of the present invention to provide a novel copper-alloy interconnection formed in a narrow trench groove of an insulation film, wherein the copper-alloy interconnection has crystal grains with large sizes and reduced grain boundary.

It is a further object of the present invention to provide a novel copper-alloy interconnection formed in a narrow trench groove of an insulation film, wherein the copper-alloy interconnection has a reduced mass-transfer path for copper atoms.

It is a still further object of the present invention to provide a novel copper-alloy interconnection in a narrow trench groove of an insulation film, wherein the copper-alloy interconnection is capable of suppressing electromigration.

It is yet a further object of the present invention to provide a novel copper-alloy interconnection formed in a narrow trench groove of an insulation film, wherein the copper-alloy interconnection is free from a disconnection of the copper-alloy interconnection.

It is yet a further object of the present invention to provide a novel copper-alloy interconnection formed in a narrow trench groove of an insulation film, wherein the copper-alloy interconnection is free from a crack of the copper-alloy interconnection.

It is yet a further object of the present invention to provide a novel copper-alloy interconnection formed in a narrow trench groove of an insulation film, wherein the copper-alloy interconnection has a high reliability.

It is yet a further object of the present invention to provide a novel copper-alloy interconnection formed in a narrow trench groove of an insulation film, wherein the copper-alloy interconnection has a high productivity.

It is another object of the present invention to provide a novel semiconductor device having an improved copper-alloy interconnection free from the above problems.

It is a further object of the present invention to provide a novel semiconductor device having an improved copper-alloy interconnection formed in a narrow trench groove of an insulation film, wherein the copper-alloy interconnection has crystal grains with large sizes and reduced grain boundary.

It is a further object of the present invention to provide a novel semiconductor device having an improved copper-alloy interconnection formed in a narrow trench groove of an insulation film, wherein the copper-alloy interconnection has a reduced mass-transfer path for copper atoms.

It is a still further object of the present invention to provide a novel semiconductor device having an improved copper-alloy interconnection formed in a narrow trench groove of an insulation film, wherein the copper-alloy interconnection is capable of suppressing electromigration.

It is yet a further object of the present invention to provide a novel semiconductor device having an improved copper-alloy interconnection formed in a narrow trench groove of an insulation film, wherein the copper-alloy interconnection is free from a disconnection of the copper-alloy interconnection.

It is yet a further object of the present invention to provide a novel semiconductor device having an improved copper-alloy interconnection formed in a narrow trench groove of an insulation film, wherein the copper-alloy interconnection is free from a crack of the copper-alloy interconnection.

It is yet a further object of the present invention to provide a novel semiconductor device having an improved copper-alloy interconnection formed in a narrow trench groove of an insulation film, wherein the copper-alloy interconnection has a high reliability.

It is yet a further object of the present invention to provide a novel semiconductor device having an improved copper-alloy interconnection formed in a narrow trench groove of an insulation film, wherein the copper-alloy interconnection has a high productivity.

It is another object of the present invention to provide a novel method of forming a copper-alloy interconnection free from the above problems.

It is a further object of the present invention to provide a novel method of forming a copper-alloy interconnection formed in a narrow trench groove of an insulation film, wherein the copper-alloy interconnection has crystal grains with large sizes and reduced grain boundary.

It is a further object of the present invention to provide a novel method of forming a copper-alloy interconnection formed in a narrow trench groove of an insulation film, wherein the copper-alloy interconnection has a reduced mass-transfer path for copper atoms.

It is a still further object of the present invention to provide a novel method of forming a copper-alloy interconnection formed in a narrow trench groove of an insulation film, wherein the copper-alloy interconnection is capable of suppressing electromigration.

It is yet a further object of the present invention to provide a novel method of forming a copper-alloy interconnection formed in a narrow trench groove of an insulation film, wherein the copper-alloy interconnection is free from a disconnection of the copper-alloy interconnection.

It is yet a further object of the present invention to provide a novel method of forming a copper-alloy interconnection formed in a narrow trench groove of an insulation film, wherein the copper-alloy interconnection is free from a crack of the copper-alloy interconnection.

It is yet a further object of the present invention to provide a novel method of forming a copper-alloy interconnection formed in a narrow trench groove of an insulation film, wherein the copper-alloy interconnection has a high reliability.

It is yet a further object of the present invention to provide a novel method of forming a copper-alloy interconnection formed in a narrow trench groove of an insulation films wherein the copper-alloy interconnection has a high productivity.

The present invention provides an electrically conductive layer comprising a copper alloy which includes at least one of Ag, As, Bi, P, Sb, Si, and Ti in the range of not less than 0.1 percent by weight to not more than a maximum solubility limit to copper, so that the copper alloy is in a solid solution and/or which includes at least one of Mo, Ta and W in a range of not less than 0.1 percent by weight to not more than 1 percent by weight.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
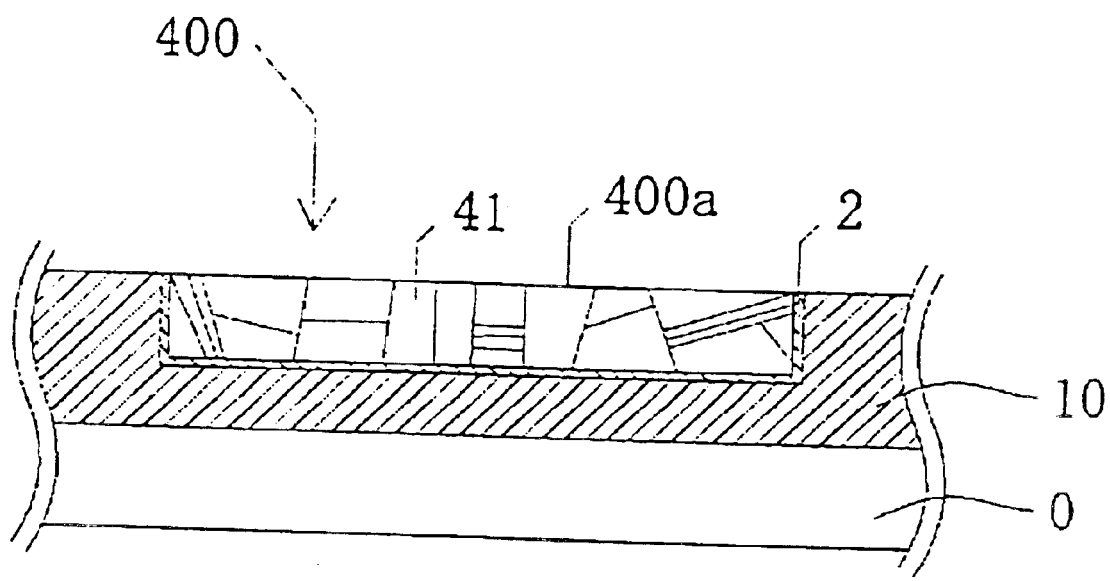
FIG. 1A is a fragmentary cross sectional elevation view illustrative of a conventional copper interconnection formed in a trench groove in an insulation film over a semiconductor substrate, taken along a plane vertical to a longitudinal direction of the copper interconnection.
Figure 1B:
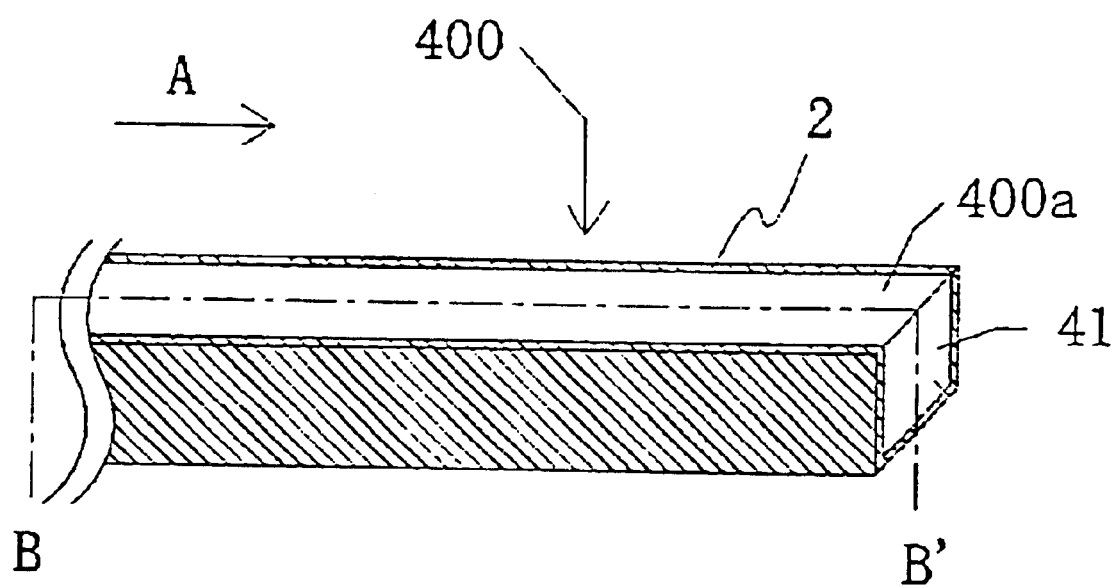
FIG. 1B is a fragmentary perspective view illustrative of the conventional copper interconnection of FIG. 1A.
Figure 1C:
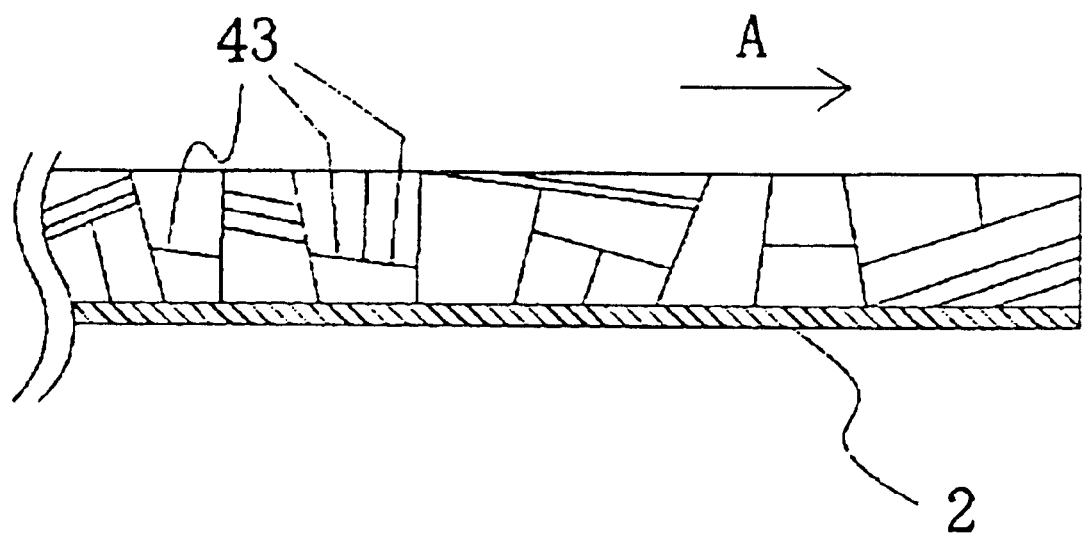
FIG. 1C is a fragmentary cross sectional elevation view illustrative of the conventional copper interconnection, taken along a B-B' line of FIG. 1B, wherein the B-B' line is parallel to the longitudinal direction of the copper interconnection.
Figure 2A:
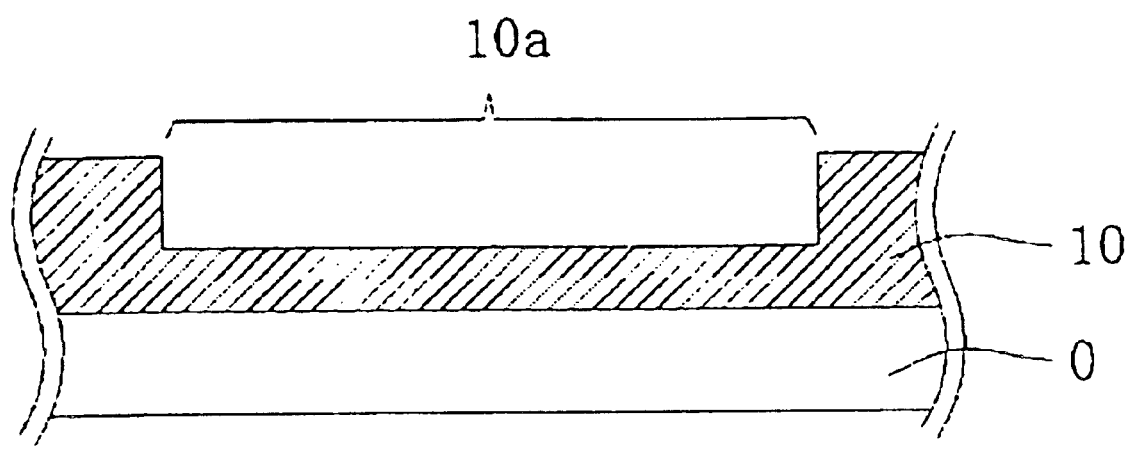
FIGS. 2A through 2D are fragmentary cross sectional elevation views illustrative of sequential steps involved in a conventional method of forming a copper interconnection formed in a trench grove in an insulation film over a semiconductor substrate, taken along a plane vertical to a longitudinal direction of the copper interconnection.
Figure 2B:
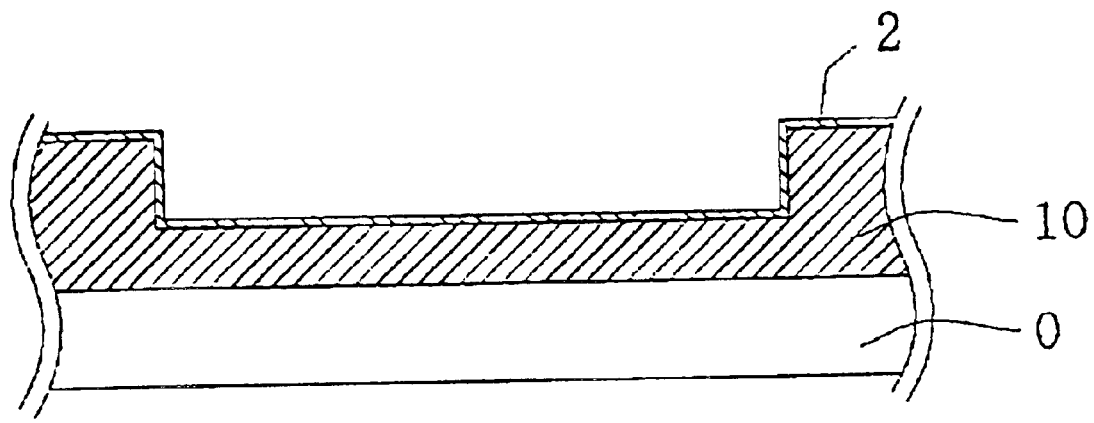
Figure 2C:
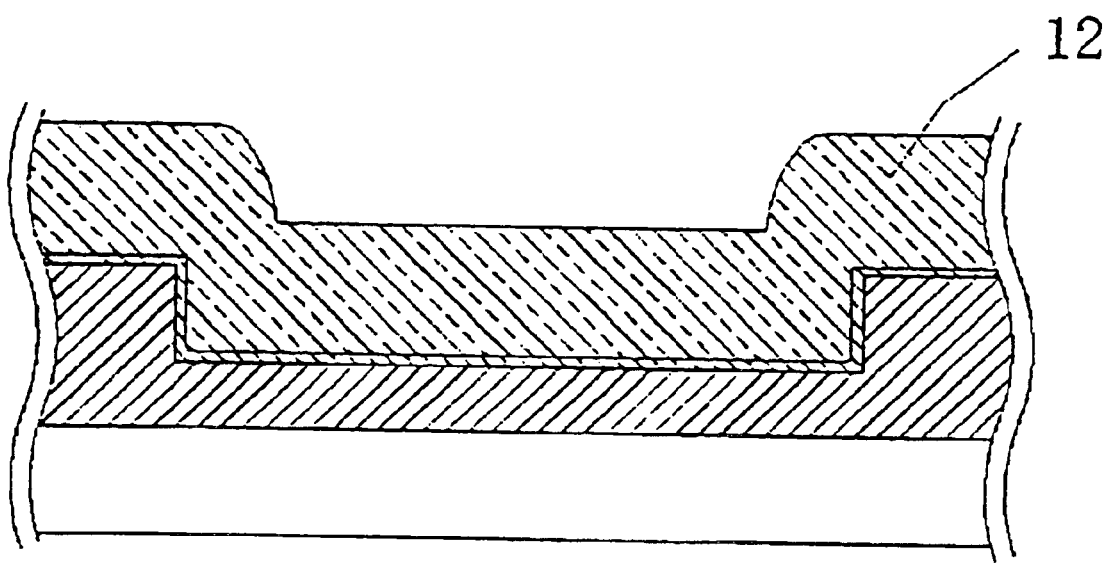
Figure 2D:
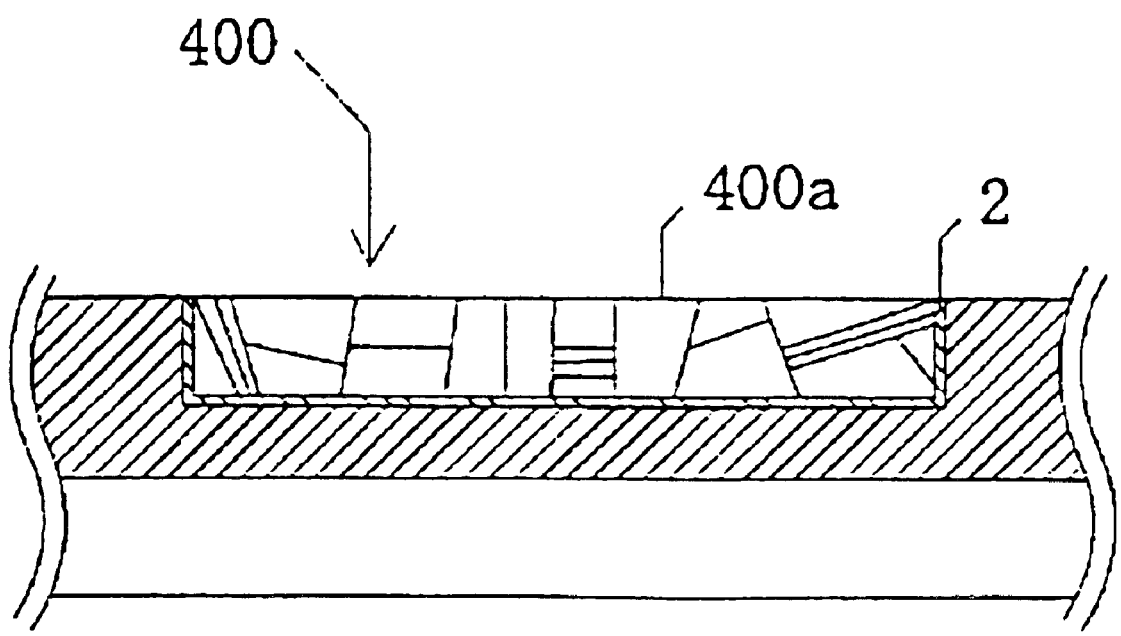

The first present invention provides an electrically conductive layer comprising a copper alloy which includes at least one of Ag, As, Bi, P, Sb, Si, and Ti at not less than 0.1 percent by weight. This electrically conductive layer may serve as an interconnection layer.

The copper alloy, which includes at least one of Ag, As, Bi, P, Sb, Si, and Ti at not less than 0.1 percent by weight, is lower in melting point than copper. This allows that the copper alloy has relatively large crystal grain sizes and reduced crystal grain boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the first present invention, at least one of Ag, As, Bi, P, Sb, and Ti is included in the copper alloy at less than 0.1 percent by weight, then it is difficult to obtain a sufficiently reduced melting point of the copper alloy, whereby the copper alloy has relatively small crystal grain sizes and many crystal grain boundaries. Further, this makes it difficult that the crystal grain boundaries are formed in vertical directions to a longitudinal direction of the interconnection or a direction along which a current flows, thereby resulting in no reduction in a mass-transfer path of copper of the interconnection. No reduction in mass-transfer path of copper of the interconnection does not suppress electromigration in the interconnection nor reduce the probability of generation of electromigration. No suppression to electromigration in the interconnection nor reduction in the probability of generation of electromigration does not reduce the probability of disconnection and crack of the interconnection. No reduction in the probability of disconnection and crack of the interconnection does not improve the reliability and the productivity of a semiconductor device having the interconnection.

It is preferable that the at least one of Ag, As, Bi, P, Sb, Si, and Ti is included in the copper alloy in a range of not less than 0.1 percent by weight to not more than a maximum solubility limit to copper, so that the copper alloy is in a solid solution.

As described above, since the copper alloy, which includes at least one of Ag, As, Bi, P, Sb, Si, and Ti at not less than 0.1 percent by weight, is lower in melting point than copper. This allows that the copper alloy has relatively large crystal grain sizes and reduced crystal grain boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

Further, since the copper alloy includes at least one of Ag, As, Bi, P, Sb, Si, and Ti at not more than a maximum solubility limit to copper, the copper alloy is in a solid solution in order to prevent formation of any copper compound which is brittle. The solid solution of the copper alloy reduces the probability of disconnection and crack of the interconnection. The reduction in the probability of disconnection and crack of the interconnection improves the reliability and the productivity of a semiconductor device having the interconnection.

If, contrary to the first present invention, at least one of Ag, As, Bi, P, Sb, Si, and Ti is included in the copper alloy at more than the maximum solubility limit to copper, the copper alloy is in a copper compound which is brittle. This copper compound increases the high probability of disconnection and crack of the interconnection. The increase in the probability of disconnection and crack of the interconnection deteriorates the reliability and the productivity of a semiconductor device having the interconnection.

It is further possible that, in addition to the above at least one of Ag, As, Bi, P, Sb, Si, and Ti, the copper alloy further includes at least one of Mo, Ta and W in a range of not less than 0.1 percent by weight to not more than 1 percent by weight.

At least one of Mo, Ta and W is further included in the copper alloy including at least one of Ag, As, Bi, P, Sb, Si, and Ti in a range of not less than 0.1 percent by weight to not more than 1 percent by weight. The role of Mo, Ta and W in the copper alloy is different from Ag, As, Bi, P, Sb, Si, and Ti. Each of Mo, Ta and W exists on the copper crystal gain boundaries and/or within the copper crystal grains. Mo, Ta and W are larger in density than Cu. Thus, Mo, Ta and W are lower in mobility through the copper alloy than Cu. Mo, Ta and W are likely to be precipitated on the crystal grain boundaries to suppress diffusion of copper. Namely, Mo, Ta and W suppress the mass-transfer of copper through the copper alloy. Resistivity of each of Mo, Ta and W is not more than ten times of a copper resistivity. The additional inclusion of at least one of Mo, Ta and W suppress the mass-transfer or diffusion of copper through the copper alloy without any excessive increase in resistivity of the copper alloy. The suppression of the mass-transfer or diffusion of copper through the copper alloy suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Mo, Ta and W is further included in the copper alloy at more than 1 percent by weight, then the resistivity of the copper alloy is too high, and the resistance of the interconnection is too high.

If, contrary to the present invention, at least one of Mo, Ta and W is further included in the copper alloy at less than 0.1 percent by weight, the effect of further suppressing the mass-transfer of copper through the copper alloy is insufficient, resulting in insufficient effect of further suppression to the mass-transfer or diffusion of copper through the copper alloy. The effect of further suppressing electromigration in the interconnection or further reducing the probability of generation of electromigration is insufficient. The insufficient effect of further suppression to electromigration in the interconnection or further reduction in the probability of generation of electromigration results in an insufficient further reduction in probability disconnection and crack of the interconnection. The insufficient reduction in the probability of disconnection and crack of the interconnection results in insufficient further improvement in the reliability and the productivity of a semiconductor device having the interconnection.

Alternatively, it is possible that in place of at least one of Mo, Ta and W, the copper alloy further includes at least one of Cr and Ni in a range of not less than 0.1 percent by weight to not more than 1 percent by weight in addition to the above at least one of Ag, As, Bi, P, Sb, Si, and Ti. The role of Cr and Ni in the copper alloy is the same as Mo, Ta, and W but different from Ag, As, Bi, P, Sb, Si, and Ti. Each of Cr and Ni exists on the copper crystal grain boundaries and/or within the copper crystal grains. Cr and Ni are larger in density than Cu. Thus, Cr and Ni are lower in mobility through the copper alloy than Cu. Cr and Ni are likely to be precipitated on the crystal grain boundaries to suppress diffusion of copper. Namely, Cr and Ni suppress the mass-transfer of copper through the copper alloy. Resistivity of each of Cr and Ni is not more than ten times of a copper resistivity. The additional inclusion of at least one of Cr and Ni suppress the mass-transfer or diffusion of copper through the copper alloy without any excessive increase in resistivity of the copper alloy. The suppression of the mass-transfer or diffusion of copper through the copper alloy suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Cr and Ni is further included in the copper alloy at less than 0.1 percent by weight, the effect, of further suppressing the mass-transfer of copper through the copper alloy is insufficient, resulting in insufficient effect of further suppression to the mass-transfer or diffusion of copper through the copper alloy. The effect of further suppressing electromigration in the interconnection or further reducing the probability of generation of electromigration is insufficient. The insufficient effect of further suppression to electromigration in the interconnection or further reduction in the probability of generation of electromigration results in an insufficient further reduction in probability of disconnection and crack of the interconnection. The insufficient reduction in the probability of disconnection and crack of the interconnection results in insufficient further improvement in the reliability and the productivity of a semiconductor device having the interconnection.

It is also possible that in addition to the above at least one of Ag, As, Bi, P, Sb, Si, and Ti, the copper alloy further includes at least one of Cr and Ni in combination with at least one of Mo, Ta and W.

Alternatively, it is possible that in addition to the above at least one of Ag, As, Bi, P, Sb, Si, and Ti, the copper alloy further includes at least one of Ge and Mg in a range of not less than 0.1 percent by weight to not more than a maximum solubility limit to copper. The role of Ge and Mg in the copper alloy is the same as Ag, As, Bi, P, Sb, Si, and Ti.

The copper alloy, which includes at least one of Ag, As, Bi, P, Sb, Si, and Ti in combination with at least one of Ge and Mg is lower in melting point than copper. This allows that the copper alloy has relatively large crystal grain sizes and reduced crystal gram boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

Further, since the copper alloy includes at least one of Ag, As, Bi, P, Sb, Si, and Ti in combination with at least one of Ge and Mg at not more than a maximum solubility limit to copper, the copper alloy is in a solid solution in order to prevent formation of any copper compound which is brittle. The solid solution of the copper alloy reduces the probability of disconnection and crack of the interconnection. The reduction in the probability of disconnection and crack of the interconnection improves the reliability and the productivity of a semiconductor device having the interconnection.

It is also possible that in addition to the above at least one of Ag, As, Bi, P, Sb, Si, and Ti and in addition to the above at least one of Ge and Mg, the copper alloy further includes at least one of Mo, Ta and W in a range of not less than 0.1 percent by weight to not more than 1 percent by weight.

Alternatively, it is also possible that in addition to the above at least one of Ag, As, Bi, P, Sb, Si, and Ti and in addition to the above at least one of Ge and Mg, the copper alloy further includes at least one of Cr and Ni in a range of not less than 0.1 percent by weight to not more than 1 percent by weight.

Alternatively, it is also possible that in addition to the above at least one of Ag, As, Bi, P, Sb, Si, and Ti and in addition to the above at least one of Ge and Mg, as well as in addition to the at least one of Mo, Ta and W, said copper alloy further includes at least one of Cr and Ni in a range of not less than 0.1 percent by weight to not more than 1 percent by weight.

It is further preferable that the interconnection layer exists within a groove in an insulation layer. It is easy to accurately control the width of the groove in the insulation layer. This means it easy to accurately control the width of the copper-alloy interconnection. This allows realization of the fine interconnection with the reduced width in order to realize the increased degree of integration of the semiconductor device.

It is further more preferable that the interconnection layer exists on a barrier metal layer extending on a bottom and side walls of the groove. The barrier metal layer increases an adhesiveness of the copper-alloy interconnection to the insulation layer. Further, the barrier metal layer prevents a diffusion of copper atoms in the copper-alloy interconnection to the insulation layer.

The second present invention provides an electrically conductive layer comprising a copper alloy which includes at least one of Mo, Ta and W in a range of not less than 0.1 percent by weight to not more than 1 percent by weight.

At least one of Mo, Ta and W is included in the copper alloy in a range of not less than 0.1 percent by weight to not more than 1 percent by weight. Each of Mo, Ta and W exists on the copper crystal gain boundaries and/or within the copper crystal grains. Mo, Ta and W are larger in density than Cu. Thus, Mo, Ta and W are lower in mobility through the copper alloy than Cu. Mo, Ta and W are likely to be precipitated on the crystal grain boundaries to suppress diffusion of copper. Namely, Mo, Ta and W suppress the mass-transfer of copper through the copper alloy. Resistivity of each of Mo, Ta and W is not more than ten times of a copper resistivity. The inclusion of at least one of Mo, Ta and W suppress the mass-transfer or diffusion of copper through the copper alloy without any excessive increase in resistivity of the copper alloy. The suppression of the mass-transfer or diffusion of copper through the copper alloy suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Mo, Ta and W is included in the copper alloy at more than 1 percent by weight, then the resistivity of the copper alloy is too high, and the resistance of the interconnection is too high.

If, contrary to the present invention, at least one of Mo, Ta and W is included in the copper alloy at less than 0.1 percent by weight, the effect of suppressing the mass-transfer of copper through the copper alloy is insufficient, resulting in insufficient effect of suppression to the mass-transfer or diffusion of copper through the copper alloy. The effect of suppressing electromigration in the interconnection or reducing the probability of generation of electromigration is insufficient. The insufficient effect of suppression to electromigration in the interconnection or further reduction in the probability of generation of electromigration results in an insufficient reduction in probability of disconnection and crack of the interconnection. The insufficient reduction in the probability of disconnection and crack of the interconnection results in insufficient improvement in the reliability and the productivity of a semiconductor device having the interconnection.

It is also possible that in addition to at least one of Mo, Ta and W, the copper alloy further includes at least one of Ag, As, Bi, P, Sb, Si, and Ti in a range of not less than 0.1 percent by weight to not more than a maximum solubility limit to copper.

The copper alloy, which includes at least one of Ag, As, Bi, P, Sb, Si, and Ti at not less than 0.1 percent by weight, is lower in melting point than copper. This allows that the copper alloy has relatively large crystal grain sizes and reduced crystal grain boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Ag, As, Bi, P, Sb, Si, and Ti is further included in the copper alloy at less than 0.1 percent by weight, then it is difficult to obtain a sufficiently reduced melting point of the copper alloy, whereby the copper alloy has relatively small crystal grain sizes and many crystal grain boundaries. Further, this makes it difficult that the crystal grain boundaries are formed in vertical directions to a longitudinal direction of the interconnection or a direction along which a current flows, thereby resulting in no reduction in a mass-transfer path of copper of the interconnection. No reduction in mass-transfer path of copper of the interconnection does not suppress electromigration in the interconnection nor reduce the probability of generation of electromigration. No suppression to electromigration in the interconnection nor reduction in the probability of generation of electromigration does not reduce the probability of disconnection and crack of the interconnection. No reduction in the probability of disconnection and crack of the interconnection does not improve the reliability and the productivity of a semiconductor device having the interconnection.

Further, since the copper alloy includes at least one of Ag, As, Bi, P, Sb, Si, and Ti at not more than a maximum solubility limit to copper, the copper alloy is in a solid solution in order to prevent formation of any copper compound which is brittle. The solid solution of the copper alloy, reduces the probability of disconnection and crack of the interconnection. The reduction in the probability of disconnection and crack of the interconnection improves the reliability and the productivity of a semiconductor device having the interconnection.

If, contrary to the first present invention, at least one of Ag, As, Bi, P, Sb, Si, and Ti is included in the copper alloy at more than the maximum solubility limit to copper, the copper alloy is in a copper compound which is brittle. This copper compound increases the high probability of disconnection and crack of the interconnection. The increase in the probability of disconnection and crack of the interconnection deteriorates the reliability and the productivity of a semiconductor device having the interconnection.

It is also possible that in addition to at least one of Mo, Ta and W, the copper alloy further includes at least one of Ge and Mg in a range of not less than 0.1 percent by weight to not more than a maximum solubility limit to copper. Ge and Mg have the same role as Ag, As, Bi, P, Sb, Si, and Ti in the copper alloy.

The copper alloy, which includes at least one of Ge and Mg at not less than 0.1 percent by weight, is lower in melting point than copper. This allows that the copper alloy has relatively large crystal grain sizes and reduced crystal grain boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Ge and Mg is further included in the copper alloy at less than 0.1 percent by weight, then it is difficult to obtain a sufficiently reduced melting point of the copper alloy, whereby the copper alloy has relatively small crystal grain sizes and many crystal grain boundaries. Further, this makes it difficult that the crystal grain boundaries are formed in vertical directions to a longitudinal direction of the interconnection or a direction along which a current flows, thereby resulting in no reduction in a mass-transfer path of copper of the interconnection. No reduction in mass-transfer path of copper of the interconnection does not suppress electromigration in the interconnection nor reduce the probability of generation of electromigration. No suppression to electromigration in the interconnection nor reduction in the probability of generation of electromigration does not reduce the probability of disconnection and crack of the interconnection. No reduction in the probability of disconnection and crack of the interconnection does not improve the reliability and the productivity of a semiconductor device having the interconnection.

Further, since the copper alloy includes at least one of Ge and Mg at not more than a maximum solubility limit to copper, the copper alloy is in a solid solution in order to prevent formation of any copper compound which is brittle. The solid solution of the copper alloy reduces the probability of disconnection and crack of the interconnection. The reduction in the probability of disconnection and crack of the interconnection improves the reliability and the productivity of a semiconductor device having the interconnection.

If, contrary to the first present invention, at least one of Ge and Mg is included in the copper alloy at more than the maximum solubility limit to copper, the copper alloy is in a copper compound which is brittle. This copper compound increases the high probability of disconnection and crack of the interconnection. The increase in the probability of disconnection and crack of the interconnection deteriorates the reliability and the productivity of a semiconductor device having the interconnection.

It is also possible that in addition to at least one of Mo, Ta and W, and in addition to at least one of Ag, As, Bi, P, Sb, Si, and Ti, the copper alloy further includes at least one of Ge and Mg in a range of not less than 0.1 percent by weight to not more than a maximum solubility limit to copper. Ge and Mg have the same role as Ag, As, Bi, P, Sb, Si, and Ti in the copper alloy.

It is also possible that in addition to at least one of Mo, Ta and W, the copper alloy further includes at least one of Cr and Ni in a range of not less than 0.1 percent by weight to not more than 1 percent by weight. Cr and Ni have the same role as the Mo, Ta and W in the copper alloy.

It is also possible that in addition to at least one of Mo, Ta and W, and in addition to at least one of Ag, As, Bi, P, Sb, Si, and Ti, the copper alloy further includes at least one of Cr and Ni in a range of not less than 0.1 percent by weight to not more than 1 percent by weight. Cr and Ni have the same role as the Mo, Ta and W in the copper alloy.

It is also possible that in addition to at least one of Mo, Ta and W, and in addition to at least one of Ge and Mg, the copper alloy further includes at least one of Cr and Ni in a range of not less than 0.1 percent by weight to not more than 1 percent by weight. Cr and Ni have the same role as the Mo, Ta and W in the copper alloy.

It is also possible that in addition to at least one of Mo, Ta and W, and in addition to at least one of Ge and Mg, as well as in addition to at least one of Ag, As, Bi, P, Sb, Si, and Ti, the copper alloy further includes at least one of Cr and Ni in a range of not less than 0.1 percent by weight to not more than 1 percent by weight. Cr and Ni have the same role as the Mo, Ta and W in the copper alloy.

It is further preferable that the interconnection layer exists within a groove in an insulation layer. It is easy to accurately control the width of the groove in the insulation layer. This means it easy to accurately control the width of the copper-alloy interconnection. This allows realization of the fine interconnection with the reduced width in order to realize the increased degree of integration of the semiconductor device.

It is further more preferable that the interconnection layer exists on a barrier metal layer extending on a bottom and side walls of the groove. The barrier metal layer increases an adhesiveness of the copper-alloy interconnection to the insulation layer. Further, the barrier metal layer prevents a diffusion of copper atoms in the copper-alloy interconnection to the insulation layer.

The third present invention provides a semiconductor device comprising: a semiconductor substrate; an insulation layer over the semiconductor substrate, and the insulation layer having a groove; a barrier metal layer on a bottom and side walls of the groove; and an interconnection layer on the barrier metal layer, and the interconnection layer filling the groove, wherein the interconnection layer comprises a copper alloy which includes at least one of Ag, As, Bi, P, Sb, Si, and Ti in a range of not less than 0.1 percent by weight to not more than a maximum solubility limit to copper, so that the copper alloy is in a solid solution.

The copper alloy, which includes at least one of Ag, As, Bi, P, Sb, Si, and Ti at not less than 0.1 percent by weight, is lower in melting point than copper. This allows that the copper alloy has relatively large crystal grain sizes and reduced crystal grain boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the first present invention, at least one of Ag, As, Bi, P, Sb, Si, and Ti is included in the copper alloy at less than 0.1 percent by weight, then it is difficult to obtain a sufficiently reduced melting point of the copper alloy, whereby the copper alloy has relatively small crystal grain sizes and many crystal grain boundaries. Further, this makes it difficult that the crystal grain boundaries are formed in vertical directions to a longitudinal direction of the interconnection or a direction along which a current flows, thereby resulting in no reduction in a mass-transfer path of copper of the interconnection. No reduction in mass-transfer path of copper of the interconnection does not suppress electromigration in the interconnection nor reduce the probability of generation of electromigration. No suppression to electromigration in the interconnection nor reduction in the probability of generation of electromigration does not reduce the probability of disconnection and crack of the interconnection. No reduction in the probability of disconnection and crack of the interconnection does not improve the reliability and the productivity of a semiconductor device having the interconnection.

It is preferable that the at least one of Ag, As, Bi, P, Sb, Si, and Ti is included in the copper alloy in a range of not less than 0.1 percent by weight to not more than a maximum solubility limit to copper, so that the copper alloy is in a solid solution.

As described above, since the copper alloy, which includes at least one of Ag, As, Bi, P, Sb, Si, and Ti at not less than 0.1 percent by weight, is lower in melting point than copper. This allows that the copper alloy has relatively large crystal grain sizes and reduced crystal grain boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

Further, since the copper alloy includes at least one of Ag, As, Bi, P, Sb, Si, and Ti at not more than a maximum solubility limit to copper, the copper alloy is in a solid solution in order to prevent formation of any copper compound which is brittle. The solid solution of the copper alloy reduces the probability of disconnection and crack of the interconnection. The reduction in the probability of disconnection and crack of the interconnection improves the reliability and the productivity of a semiconductor device having the interconnection.

If, contrary to the first present invention, at least one of Ag, As, Bi, P, Sb, Si, and Ti is included in the copper alloy at more than the maximum solubility limit to copper, the copper alloy is in a copper compound which is brittle. This copper compound increases the high probability of disconnection and crack of the interconnection. The increase in the probability of disconnection and crack of the interconnection deteriorates the reliability and the productivity of a semiconductor device having the interconnection.

The interconnection layer exists within a groove in an insulation layer. It is easy to accurately control the width of the groove in the insulation layer. This means it easy to accurately control the width of the copper-alloy interconnection. This allows realization of the fine interconnection with the reduced width in order to realize the increased degree of integration of the semiconductor device.

The interconnection layer exists on a barrier metal layer extending on a bottom and side walls of the groove. The barrier metal layer increases an adhesiveness of the copper-alloy interconnection to the insulation layer. Further, the barrier metal layer prevents a diffusion of copper atoms in the copper-alloy interconnection to the insulation layer.

It is further possible that, in addition to the above at least one of Ag, As, Bi, P, Sb, Si, and Ti, the copper alloy further includes at least one of Mo, Ta and W in a range of not less than 0.1 percent by weight to not more than 1 percent by weight.

At least one of Mo, Ta and W is further included in the copper alloy including at least one of Ag, As, Bi, P, Sb, Si, and Ti in a range of not less than 0.1 percent by weight to not more than 1 percent by weight. The role of Mo, Ta and W in the copper alloy is different from Ag, As, Bi, P, Sb, Si, and Ti. Each of Mo, Ta and W exists on the copper crystal grain boundaries and/or within the copper crystal grains. Mo, Ta and W are larger in density than Cu. Thus, Mo, Ta and W are lower in mobility through the copper alloy than Cu. Mo, Ta and W are likely to be precipitated on the crystal grain boundaries to suppress diffusion of copper. Namely, Mo, Ta and W suppress the mass-transfer of copper through the copper alloy. Resistivity of each of Mo, Ta and W is not more than ten times of a copper resistivity. The additional inclusion of at least one of Mo, Ta and W suppress the mass-transfer or diffusion of copper through the copper alloy without any excessive increase in resistivity of the copper alloy. The suppression of the mass-transfer or diffusion of copper through the copper alloy suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Mo, Ta and W is further included in the copper alloy at more than 1 percent by weight, then the resistivity of the copper alloy is too high, and the resistance of the interconnection is too high.

If, contrary to the present invention, at least one of Mo, Ta and W is further included in the copper alloy at less than 0.1 percent by weight, the effect of further suppressing the mass-transfer of copper through the copper alloy is insufficient, resulting in insufficient effect of further suppression to the mass-transfer or diffusion of copper through the copper alloy. The effect of further suppressing electromigration in the interconnection or further reducing the probability of generation of electromigration is insufficient. The insufficient effect of further suppression to electromigration in the interconnection or further reduction in the probability of generation of electromigration results in an insufficient further reduction in probability of disconnection and crack of the interconnection. The insufficient reduction in the probability of disconnection and crack of the interconnection results in insufficient further improvement in the reliability and the productivity of a semiconductor device having the interconnection.

Alternatively, it is possible that in place of at least one of Mo, Ta and W, the copper alloy further includes at least one of Cr and Ni in a range of not less than 0.1 percent by weight to not more than 1 percent by weight in addition to the above at least one of Ag, As, Bi, P, Sb, Si, and Ti. The role of Cr and Ni in the copper alloy is the same as Mo, Ta, and W but different from Ag, As, Bi, P, Sb, Si, and Ti. Each of Cr and Ni exists on the copper crystal grain boundaries and/or within the copper crystal grains. Cr and Ni are larger in density than Cu. Thus, Cr and Ni are lower in mobility through the copper alloy than Cu. Cr and Ni are likely to be precipitated on the crystal grain boundaries to suppress diffusion of copper. Namely, Cr and Ni suppress the mass-transfer of copper through the copper alloy. Resistivity of each of Cr and Ni is not more than ten times of a copper resistivity. The additional inclusion of at least one of Cr and Ni suppress the mass-transfer or diffusion of copper through the copper alloy without any excessive increase in resistivity of the copper alloy. The suppression of the mass-transfer or diffusion of copper through the copper alloy suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Cr and Ni is further included in the copper alloy at less than 0.1 percent by weight, the effect of further suppressing the mass-transfer of copper through the copper alloy is insufficient, resulting in insufficient effect of further suppression to the mass-transfer or diffusion of copper through the copper alloy. The effect of further suppressing electromigration in the interconnection or further reducing the probability of generation of electromigration is insufficient. The insufficient effect of further suppression to electromigration in the interconnection or further reduction in the probability of generation of electromigration results in an insufficient further reduction in probability of disconnection and crack of the interconnection. The insufficient reduction in the probability of disconnection and crack of the interconnection results in insufficient further improvement in the reliability and the productivity of a semiconductor device having the interconnection.

It is also possible that in addition to the above at least one of Ag, As, Bi, P, Sb, Si, and Ti, the copper alloy further includes at least one of Cr and Ni in combination with at least one of Mo, Ta and W.

Alternatively, it is possible that in addition to the above at least one of Ag, As, Bi, P, Sb, Si, and Ti, the copper alloy further includes at least one of Ge and Mg in a range of not less than 0.1 percent by weight to not more than a maximum solubility limit to copper. The role of Ge and Mg in the copper alloy is the same as Ag, As, Bi, P, Sb, Si, and Ti.

The copper alloy, which includes at least one of Ag, As, Bi, P, Sb, Si, and Ti in combination with at least one of Ge and Mg is lower in melting point than copper. This allows that the copper alloy has relatively large crystal grain sizes and reduced crystal grain boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

Further, since the copper alloy includes at least one of Ag, As, Bi, P, Sb, Si, and Ti in combination with at least one of Ge and Mg at not more than a maximum solubility limit to copper, the copper alloy is in a solid solution in order to prevent formation of any copper compound which is brittle. The solid solution of the copper alloy reduces the probability of disconnection and crack of the interconnection. The reduction in the probability of disconnection and crack of the interconnection improves the reliability and the productivity of a semiconductor device having the interconnection.

It is also possible that in addition to the above at least one of Ag, As, Bi, P, Sb, Si, and Ti and in addition to the above at least one of Ge and Mg, the copper alloy further includes at least one of Mo, Ta and W in a range of not less than 0.1 percent by weight to not more than 1 percent by weight.

Alternatively, it is also possible that in addition to the above at least one of Ag, As, Bi, P, Sb, Si, and Ti and in addition to the above at least one of Ge and Mg, the copper alloy further includes at least one of Cr and Ni in a range of not less than 0.1 percent by weight to not more than 1 percent by weight.

Alternatively, it is also possible that in addition to the above at least one of Ag, As, Bi, P, Sb, Si, and Ti and in addition to the above at least one of Ge and Mg, as well as in addition to the at least one of Mo, Ta and W, said copper alloy further includes at least one of Cr and Ni in a range of not less than 0.1 percent by weight to not more than 1 percent by weight.

The fourth present invention provides a semiconductor device comprising: a semiconductor substrate; an insulation layer over the semiconductor substrate, and the insulation layer having a groove; a barrier metal layer on a bottom and side walls of the groove; and an interconnection layer on the barrier metal layer, and the interconnection layer filling the groove, wherein the interconnection layer comprises a copper alloy which includes at least one of Mo, Ta and W in a range of not less than 0.1 percent by weight to not more than 1 percent by weight.

At least one of Mo, Ta and W is included in the copper alloy in a range of not less than 0.1 percent by weight to not more than 1 percent by weight. Each of Mo, Ta and W exists on the copper crystal grain boundaries and/or within the copper crystal grains. Mo, Ta and W are larger in density than Cu. Thus, Mo, Ta and W are lower in mobility through the copper alloy than Cu. Mo, Ta and W are likely to be precipitated on the crystal grain boundaries to suppress diffusion of copper. Namely, Mo, Ta and W suppress the mass-transfer of copper through the copper alloy. Resistivity of each of Mo, Ta and W is not more than ten times of a copper resistivity. The inclusion of at least one of Mo, Ta and W suppress the mass-transfer or diffusion of copper through the copper alloy without any excessive increase in resistivity of the copper alloy. The suppression of the mass-transfer or diffusion of copper through the copper alloy suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Mo, Ta and W is included in the copper alloy at more than 1 percent by weight, then the resistivity of the copper alloy is too high, and the resistance of the interconnection is too high.

If, contrary to the present invention, at least one of Mo, Ta and W is included in the copper alloy at less than 0.1 percent by weight, the effect of suppressing the mass-transfer of copper through the copper alloy is insufficient, resulting in insufficient effect of suppression to the mass-transfer or diffusion of copper through the copper alloy. The effect of suppressing electromigration in the interconnection or reducing the probability of generation of electromigration is insufficient. The insufficient effect of suppression to electromigration in the interconnection or further reduction in the probability of generation of electromigration results in an insufficient reduction in probability of disconnection and crack of the interconnection. The insufficient reduction in the probability of disconnection and crack of the interconnection results in insufficient improvement in the reliability and the productivity of a semiconductor device having the interconnection.

It is further preferable that the interconnection layer exists within a groove in an insulation layer. It is easy to accurately control the width of the groove in the insulation layer. This means it easy to accurately control the width of the copper-alloy interconnection. This allows realization of the fine interconnection with the reduced width in order to realize the increased degree of integration of the semiconductor device.

It is further more preferable that the interconnection layer exists on a barrier metal layer extending on a bottom and side walls of the groove. The barrier metal layer increases an adhesiveness of the copper-alloy interconnection to the insulation layer. Further, the barrier metal layer prevents a diffusion of copper atoms in the copper-alloy interconnection to the insulation layer.

It is also possible that in addition to at least one of Mo, Ta and W, the copper alloy further includes at least one of Ag, As, Bi, P, Sb, Si, and Ti in a range of not less than 0.1 percent by weight to not more than a maximum solubility limit to copper.

The copper alloy, which includes at least one of Ag, As, Bi, P, Sb, Si, and Ti at not less than 0.1 percent by weight, is lower in melting point than copper. This allows that the copper alloy has relatively large crystal grain sizes and reduced crystal grain boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Ag, As, Bi, P, Sb, Si, and Ti is further included in the copper alloy at less than 0.1 percent by weight, then it is difficult to obtain a sufficiently reduced melting point of the copper alloy, whereby the copper alloy has relatively small crystal grain sizes and many crystal grain boundaries. Further, this makes it difficult that the crystal grain boundaries are formed in vertical directions to a longitudinal direction of the interconnection or a direction along which a current flows, thereby resulting in no reduction in a mass-transfer path of copper of the interconnection. No reduction in mass-transfer path of copper of the interconnection does not suppress electromigration in the interconnection nor reduce the probability of generation of electromigration. No suppression to electromigration in the interconnection nor reduction in the probability of generation of electromigration does not reduce the probability of disconnection and crack of the interconnection. No reduction in the probability of disconnection and crack of the interconnection does not improve the reliability and the productivity of a semiconductor device having the interconnection.

Further, since the copper alloy includes at least one of Ag, As, Bi, P, Sb, Si, and Ti at not more than a maximum solubility limit to copper, the copper alloy is in a solid solution in order to prevent formation of any copper compound which is brittle. The solid solution of the copper alloy reduces the probability of disconnection and crack of the interconnection. The reduction in the probability of disconnection and crack of the interconnection improves the reliability and the productivity of a semiconductor device having the interconnection.

If, contrary to the first present invention, at least one of Ag, As, Bi, P, Sb, Si, and Ti is included in the copper alloy at more than the maximum solubility limit to copper, the copper alloy is in a copper compound which is brittle. This copper compound increases the high probability of disconnection and crack of the interconnection. The increase in the probability of disconnection and crack of the interconnection deteriorates the reliability and the productivity of a semiconductor device having the interconnection.

It is also possible that in addition to at least one of Mo, Ta and W, the copper alloy further includes at least one of Ge and Mg in a range of not less than 0.1 percent by weight to not more than a maximum solubility limit to copper. Ge and Mg have the same role as Ag, As, Bi, P, Sb, Si, and Ti in the copper alloy.

The copper alloy, which includes at least one of Ge and Mg at not less than 0.1 percent by weight, is lower in melting point than copper. This allows that the copper alloy has relatively large crystal grain sizes and reduced crystal grain boundaries. Further, this allows that the crystal grain boundaries are formed in vertical directions to a longitudinal direction of the interconnection or a direction along which a current flows, thereby reducing a mass-transfer path of copper of the interconnection. The reduction in mass-transfer path of copper of the interconnection suppresses electromigration in the interconnection or reduces the probability of generation of electromigration. The suppression to electromigration in the interconnection or the reduction in the probability of generation of electromigration reduces the probability of disconnection and crack of the interconnection. The reduction in the probability of disconnection and crack of the interconnection improves the reliability and the productivity of a semiconductor device having the interconnection.

If, contrary to the present invention, at least one of Ge and Mg is further included in the copper alloy at less than 0.1 percent by weight, then it is difficult to obtain a sufficiently reduced melting point of the copper alloy, whereby the copper alloy has relatively small crystal grain sizes and many crystal grain boundaries. Further, this makes it difficult that the crystal grain boundaries are formed in vertical directions to a longitudinal direction of the interconnection or a direction along which a current flows, thereby resulting in no reduction in a mass-transfer path of copper of the interconnection. No reduction in mass-transfer path of copper of the interconnection does not suppress electromigration in the interconnection nor reduce the probability of generation of electromigration. No suppression to electromigration in the interconnection nor reduction in the probability of generation of electromigration does not reduce the probability of disconnection and crack of the interconnection. No reduction in the probability of disconnection and crack of the interconnection does not improve the reliability and the productivity of a semiconductor device having the interconnection.

Further, since the copper alloy includes at least one of Ge and Mg at not more than a maximum solubility limit to copper, the copper alloy is in a solid solution in order to prevent formation of any copper compound which is brittle. The solid solution of the copper alloy reduces the probability of disconnection and crack of the interconnection. The reduction in the probability of disconnection and crack of the interconnection improves the reliability and the productivity of a semiconductor device having the interconnection.

If, contrary to the first present invention, at least one of Ge and Mg is included in the copper alloy at more than the maximum solubility limit to copper, the copper alloy is in a copper compound which is brittle. This copper compound increases the high probability of disconnection and crack of the interconnection. The increase in the probability of disconnection and crack of the interconnection deteriorates the reliability and the productivity of a semiconductor device having the interconnection.

It is also possible that in addition to at least one of Mo, Ta and W, and in addition to at least one of Ag, As, Bi, P, Sb, Si, and Ti, the copper alloy further includes at least one of Ge and Mg in a range of not less than 0.1 percent by weight to not more than a maximum solubility limit to copper. Ge and Mg have the same role as Ag, As, Bi, P, Sb, Si, and Ti in the copper alloy.

It is also possible that in addition to at least one of Mo, Ta and W, the copper alloy further includes at least one of Cr and Ni in a range of not less than 0.1 percent by weight to not more than 1 percent by weight. Cr and Ni have the same role as the Mo, Ta and W in the copper alloy.

It is also possible that in addition to at least one of Mo, Ta and W, and in addition to at least one of Ag, As, Bi, P, Sb, Si, and Ti, the copper alloy further includes at least one of Cr and Ni in a range of not less than 0.1 percent by weight to not more than 1 percent by weight. Cr and Ni have the same role as the Mo, Ta and W in the copper alloy.

It is also possible that in addition to at least one of Mo, Ta and W, and in addition to at least one of Ge and Mg, the copper alloy further includes at least one of Cr and Ni in a range of not less than 0.1 percent by weight to not more than 1 percent by weight. Cr and Ni have the same role as the Mo, Ta and W in the copper alloy.

It is also possible that in addition to at least one of Mo, Ta and W, and in addition to at least one of Ge and Mg, as well as in addition to at least one of Ag, As, Bi, P, Sb, Si, and Ti, the copper alloy further includes at least one of Cr and Ni in a range of not less than 0.1 percent by weight to not more than 1 percent by weight. Cr and Ni have the same role as the Mo, Ta and W in the copper alloy.

The fifth present invention provides a method of forming a semiconductor device, comprising the steps of: forming a groove in an insulation layer over a semiconductor substrate;

forming a barrier metal layer on a bottom and side walls of the groove; forming a seed copper layer including at least one of Ag, As, Bi, P, Sb, Si, and Ti on the barrier metal layer; forming a copper layer on the seed copper layer so that laminations of the barrier metal layer, the seed copper layer and the copper layer fill within the groove; and carrying out a heat treatment to form an interconnection layer on the barrier metal layer, wherein the interconnection layer comprises a copper alloy which includes at least one of Ag, As, Bi, P, Sb, Si, and Ti in a range of not less than 0.1 percent by weight to not more than a maximum solubility limit to copper, so that the copper alloy is in a solid solution.

It is possible to further comprise the step of selectively removing the copper layer, so that the copper layer remains only within the groove before the heat treatment is carried out.

Alternatively, it is also possible to further comprise the step of selectively removing the interconnection layer, so that the interconnection layer remains only within the groove after the heat treatment has been carried out.

It is possible that in addition to at least one of Ag, As, Bi, P, Sb, Si, and Ti, the seed copper layer further includes at least one of Mo, Ta and W, so that the interconnection layer further includes at least one of Mo, Ta and W in a range of not less than 0.1 percent by weight to not more than 1 percent by weight in addition to at least one of Ag, As, Bi, P, Sb, Si, and Ti.

It is possible that in addition to at least one of Ag, As, Bi, P, Sb, Si, and Ti, the seed copper layer further includes at least one of Cr and Ni, so that the interconnection layer further includes at least one of Cr and Ni in a range of not less than 0.1 percent by weight to not more than 1 percent by weight in addition to at least one of Ag, As, Bi, P, Sb, Si, and Ti.

It is possible that in addition to at least one of Ag, As, Bi, P, Sb, Si, and Ti, and in addition to at least one of Mo, Ta and W, the seed copper layer further includes at least one of Cr and Ni, so that the interconnection layer further includes at least one of Cr and Ni in a range of not less than 0.1 percent by weight to not more than 1 percent by weight in addition to at least one of Ag, As, Bi, P, Sb, Si, and Ti, and in addition to at least one of Mo, Ta and W.

It is possible that in addition to at least one of Ag, As, Bi, P, Sb, Si, and Ti, the seed copper layer further includes at least one of Ge and Mg, so that the interconnection layer further includes at least one of Ge and Mg in a range of not less than 0.1 percent by weight to not more than a maximum solubility limit to copper.

It is possible that in addition to at least one of Ag, As, Bi, P, Sb, Si, and Ti, and in addition to at least one of Ge and Mg, the seed copper layer further includes at least one of Mo, Ta and W, so that the interconnection layer further includes at least one of Mo, Ta and W in a range of not less than 0.1 percent by weight to not more than 1 percent by weight in addition to at least one of Ag, As, Bi, P, Sb, Si, and Ti, and in addition to at least one of Ge and Mg.

It is possible that in addition to at least one of Ag, As, Bi, P, Sb, Si, and Ti, and in addition to at least one of Ge and Mg, the seed copper layer further includes at least one of Cr and Ni, so that the interconnection layer further includes at least one of Cr and Ni in a range of not less than 0.1 percent by weight to not more than 1 percent by weight in addition to at least one of Ag, As, Bi, P, Sb, Si, and Ti, and in addition to at least one of Ge and Mg.

It is possible that in addition to at least one of Ag, As, Bi, P, Sb, Si, and Ti, and in addition to at least one of Mo, Ta and W, the seed copper layer further includes at least one of Cr and Ni, so that the interconnection layer further includes at least one of Cr and Ni in a range of not less than 0.1 percent by weight to not more than 1 percent by weight in addition to at least one of Ag, As, Bi, P, Sb, Si, and Ti, and in addition to at least one of Mo, Ta and W.

The sixth present invention provides a method of forming a semiconductor device, comprising the steps of: forming a groove in an insulation layer over a semiconductor substrate; forming a barrier metal layer on a bottom and side walls of the groove; forming a seed copper layer including at least one of Mo, Ta and W on the barrier metal layer; forming a copper layer on the seed copper layer so that laminations of the barrier metal layer, the seed copper layer and the copper layer fill within the groove; and carrying out a heat treatment to form an interconnection layer on the barrier metal layer, wherein the interconnection layer comprises a copper alloy which includes at least one of Mo, Ta and W in a range of not less than 0.1 percent by weight to not more than 1 percent by weight.

It is possible to further comprise the step of selectively removing the copper layer, so that the copper layer remains only within the groove before the heat treatment is carried out.

Alternatively, it is also possible to further comprise the step of selectively removing the interconnection layer, so that the interconnection layer remains only within the groove after the heat treatment has been carried out.

It is possible that in addition to at least one of Mo, Ta and W, the seed copper layer further includes at least one of Ag, As, Bi, P, Sb, Si, and Ti, so that the interconnection layer further includes at least one of Ag, As, Bi, P, Sb, Si, and Ti in a range of not less than 0.1 percent by weight to not more than a maximum solubility limit to copper in addition to at least one of Mo, Ta and W.

It is possible that in addition to at least one of Mo, Ta and W, the seed copper layer further includes at least one of Ge and Mg, so that the interconnection layer further includes at least one of Ge and Mg in a range of not less than 0.1 percent by weight to not more than a maximum solubility limit to copper in addition to at least one of Mo, Ta and W.

It is possible that in addition to at least one of Mo, Ta and W, and in addition to at least one of Ag, As, Bi, P, Sb, Si, and Ti, the seed copper layer further includes at least one of Ge and Mg, so that the interconnection layer further includes at least one of Ge and Mg in a range of not less than 0.1 percent by weight to not more than a maximum solubility limit to copper in addition to at least one of Mo, Ta and W, and in addition to at least one of Ag, As, Bi, P, Sb, Si, and Ti.

It is possible that in addition to at least one of Mo, Ta and W, the seed copper layer further includes at least one of Cr and Ni, so that the interconnection layer further includes at least one of Cr and Ni in a range of not less than 0.1 percent by weight to not more than 1 percent by weight in addition to at least one of Mo, Ta and W.

It is possible that in addition to at least one of Mo, Ta and W, and in addition to at least one of Ag, As, Bi, P, Sb, Si, and Ti, the seed copper layer further includes at least one of Cr and Ni, so that the interconnection layer further includes at least one of Cr and Ni in a range of not less than 0.1 percent by weight to not more than 1 percent by weight in addition to at least one of Mo, Ta and W, and in addition to at least one of Ag, As, Bi, P, Sb, Si, and Ti.

It is possible that in addition to at least one of Mo, Ta and W, and in addition to at least one of Ag, As, Bi, P, Sb, Si, and Ti, as well as in addition to at least one of Ge and Mg, the seed copper layer further includes at least one of Cr and Ni, so that the interconnection layer further includes at least one of Cr and Ni in a range of not less than 0.1 percent by weight to not more than 1 percent by weight in addition to at least one of Mo, Ta and W, and in addition to at least one of Ag, As, Bi, P, Sb, Si, and Ti, as well as in addition to at least one of Ge and Mg.

Preferred Embodiment

First Embodiment

Figure 3A:
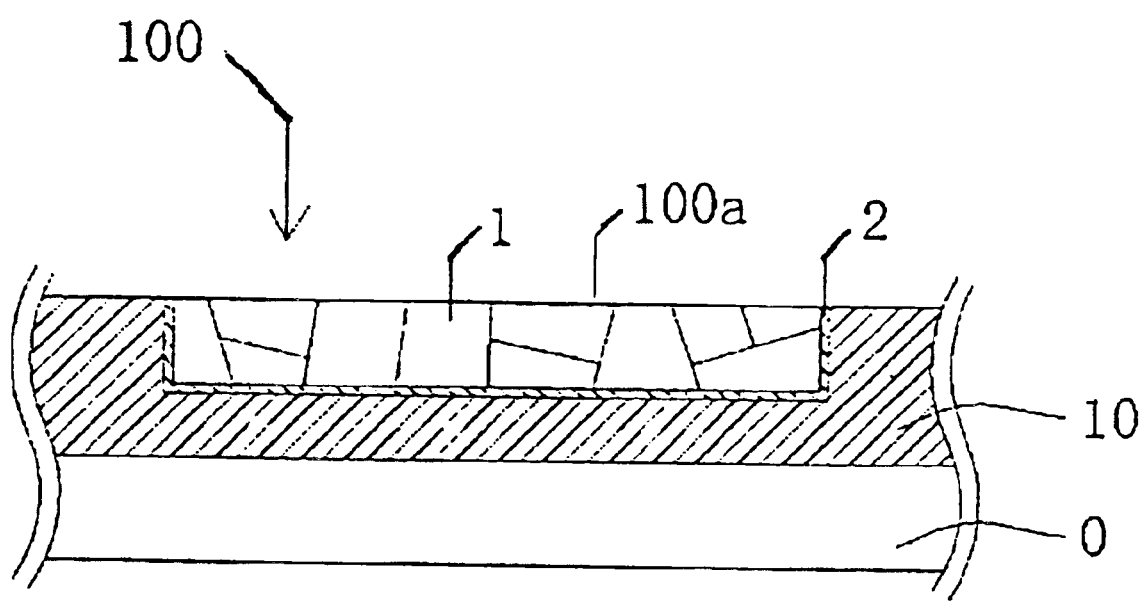
FIG. 3A is a fragmentary cross sectional elevation view illustrative of a novel copper-alloy interconnection formed in a trench groove in an insulation film over a semiconductor substrate, taken along a plane vertical to a longitudinal direction of the copper-alloy interconnection in a first embodiment in accordance with the present invention.
Figure 3B:
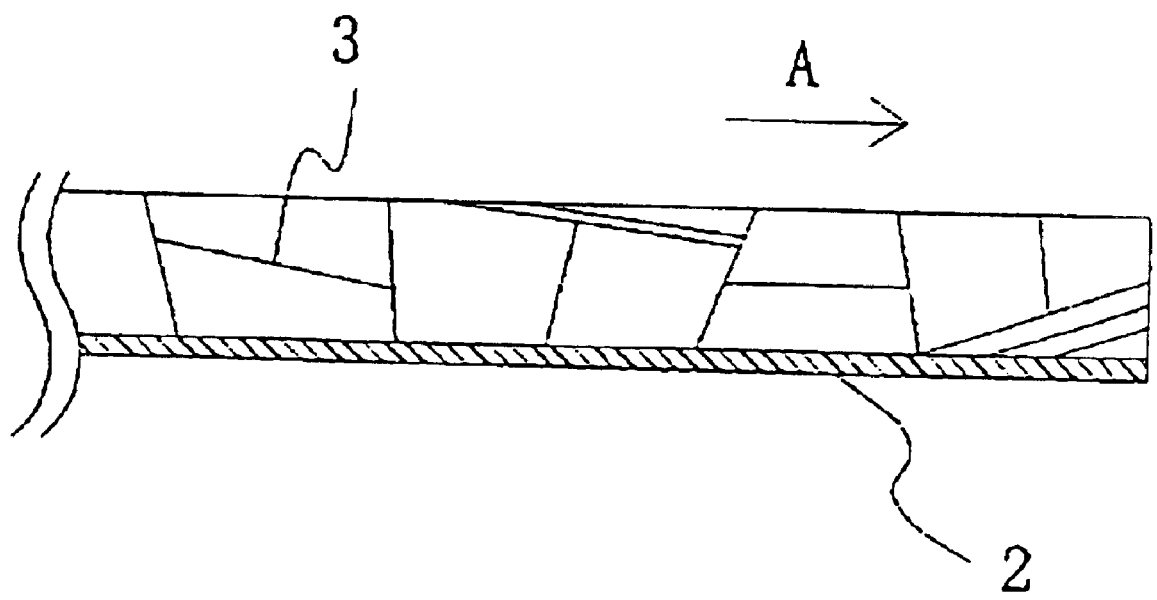
FIG. 3B is a partially enlarged view illustrative of the copper-alloy interconnection of FIG. 3A.
Figure 3C:
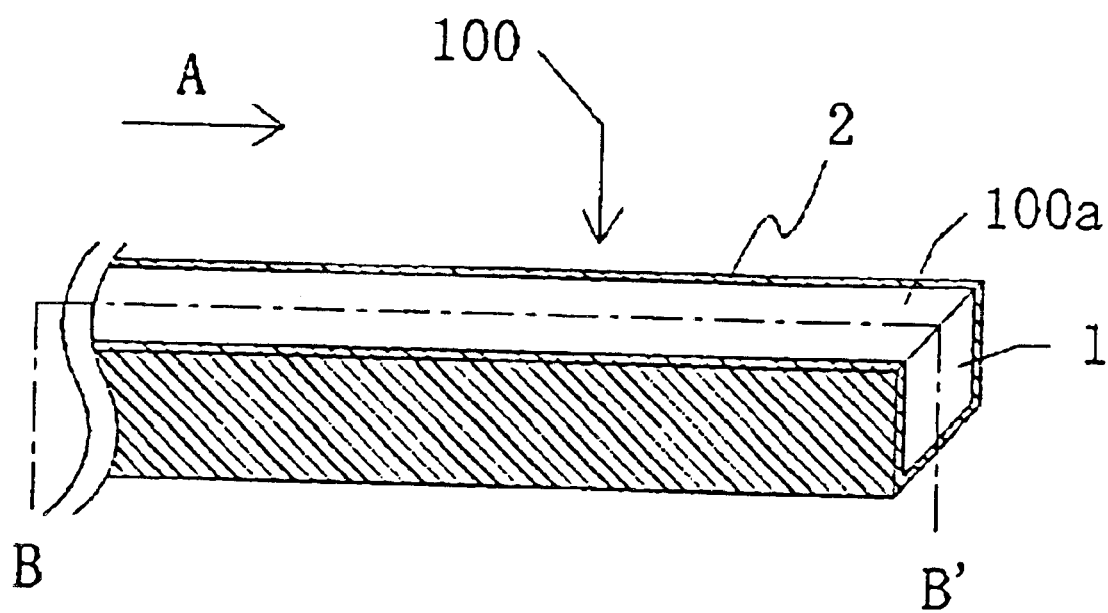
FIG. 3C is a fragmentary perspective view illustrative of the novel copper-alloy interconnection of FIG. 3A.
Figure 3D:
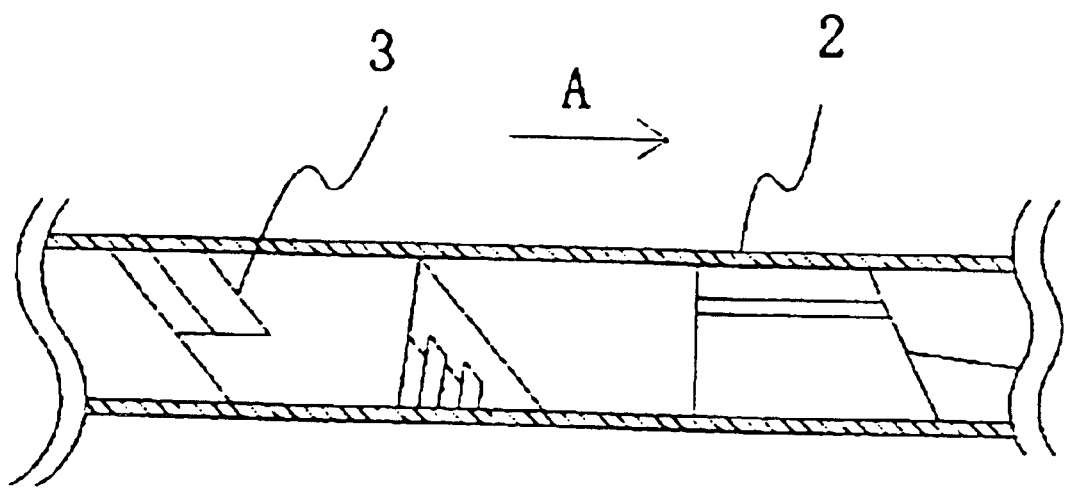
FIG. 3D is a fragmentary cross sectional elevation view illustrative of the novel copper-alloy interconnection, taken along a B-B' line of FIG. 3C, wherein the B-B' line is parallel to the longitudinal direction of the copper-alloy interconnection.

A first embodiment according to the present invention will be described in detail with reference to the drawings. FIG. 3A is a fragmentary cross sectional elevation view illustrative of a novel copper-alloy interconnection formed in a trench groove in an insulation film over a semiconductor substrate, taken along a plane vertical to a longitudinal direction of the copper-alloy interconnection in a first embodiment in accordance with the present invention. FIG. 3B is a partially enlarged view illustrative of the copper-alloy interconnection of FIG. 3A. FIG. 3C is a fragmentary perspective view illustrative of the novel copper-alloy interconnection of FIG. 3A. FIG. 3D is a fragmentary cross sectional elevation view illustrative of the novel copper-alloy interconnection, taken along a B-B' line of FIG. 3C, wherein the B-B' line is parallel to the longitudinal direction of the copper-alloy interconnection.

A copper-alloy interconnection is provided in an inter-layer insulator 10 provided on a semiconductor substrate 0. The inter-layer insulator 10 has a trench groove with a predetermined narrow width. A barrier metal layer 2 extends on a bottom and side walls of the trench groove of the inter-layer insulator 10. A copper-alloy interconnection 100 exists on the barrier metal layer, so that the copper-alloy interconnection 100 fills the trench groove of the inter-layer insulator 10. The copper-alloy interconnection 100 comprises laminations of the barrier layer 2 and a copper alloy interconnection layer 1 which includes at least one of Ag, As, Bi, P, Sb, Si, and Ti in a range of not less than 0.1 percent by weight to not more than a maximum solubility limit to copper, so that the copper alloy interconnection layer 1 is in a solid solution. The copper-alloy interconnection 100 has a top surface 100a leveled to a top surface of the inter-layer insulator 10.

The copper-alloy interconnection 100 exists within the trench groove in the inter-layer insulator 10. It is easy to accurately control the width of the trench groove in the inter-layer insulator 10. This means it easy to accurately control the width of the copper-alloy interconnection 100. This allows realization of the fine interconnection with the reduced width in order to realize the increased degree of integration of the semiconductor device.

The copper alloy interconnection layer 1 exists on the barrier metal layer 2 extending on the bottom and the side walls of the trench groove in the inter-layer insulator 10. The barrier metal layer 2 increases an adhesiveness of the copper alloy interconnection layer 1 to the inter-layer insulator 10. Further, the barrier metal layer 2 prevents a diffusion of copper atoms in the copper alloy interconnection layer 1 to the inter-layer insulator 10.

The copper alloy, which includes at least one of Ag, As, Bi, P, Sb, Si, and Ti at not less than 0.1 percent by weight, is lower in melting point than copper. This allows that the copper alloy has relatively large crystal grain sizes and reduced crystal grain boundaries as shown in FIG. 3B. Further, this allows that the crystal grain boundaries are, as shown in FIG. 3D, formed in vertical direction to a longitudinal direction of the interconnection 100 or a direction along which a current flows, thereby reducing a mass-transfer path of copper of the interconnection 100. The reduction in mass-transfer path of copper of the interconnection 100 suppresses electromigration in the interconnection 100 or reduces the probability of generation of electromigration. The suppression to electromigration in the interconnection 100 or the reduction in the probability of generation of electromigration reduces the probability of disconnection and crack of the interconnection 100. The reduction in the probability of disconnection and crack of the interconnection improves the reliability and the productivity of a semiconductor device having the interconnection 100.

If, contrary to the first present invention, at least one of Ag, As, Bi, P, Sb, Si, and Ti is included in the copper alloy at less than 0.1 percent by weight then it is difficult to obtain a sufficiently reduced melting point of the copper alloy, whereby the copper alloy has relatively small crystal grain sizes and many crystal grain boundaries. Further, this makes it difficult that the crystal grain boundaries are formed in vertical directions to a longitudinal direction of the interconnection 100 or a direction along which a current flows, thereby resulting in no reduction in a mass-transfer path of copper of the interconnection 100. No reduction in mass-transfer path of copper of the interconnection 100 does not suppress electromigration in the interconnection 100 nor reduce the probability of generation of electromigration. No suppression to electromigration in the interconnection 100 nor reduction in the probability of generation of electromigration does not reduce the probability of disconnection and crack of the interconnection 100. No reduction in the probability of disconnection and crack of the interconnection 100 does not improve the reliability and the productivity of a semiconductor device having the interconnection 100.

Further, since the copper alloy includes at least one of Ag, As, Bi, P, Sb, Si, and Ti at not more than a maximum solubility limit to copper, the copper alloy is in a solid solution in order to prevent formation of any copper compound which is brittle. The solid solution of the copper alloy reduces the probability of disconnection and crack of the interconnection 100. The reduction in the probability of disconnection and crack of the interconnection 100 improves the reliability and the productivity of a semiconductor device having the interconnection 100.

If, contrary to the first present invention, at least one of Ag, As, Bi, P, Sb, Si, and Ti is included in the copper alloy at more than the maximum solubility limit to copper, the copper alloy is in a copper compound which is brittle. This copper compound increases the high probability of disconnection and crack of the interconnection 100. The increase in the probability of disconnection and crack of the interconnection 100 deteriorates the reliability and the productivity of a semiconductor device having the interconnection 100.

Figure 4:
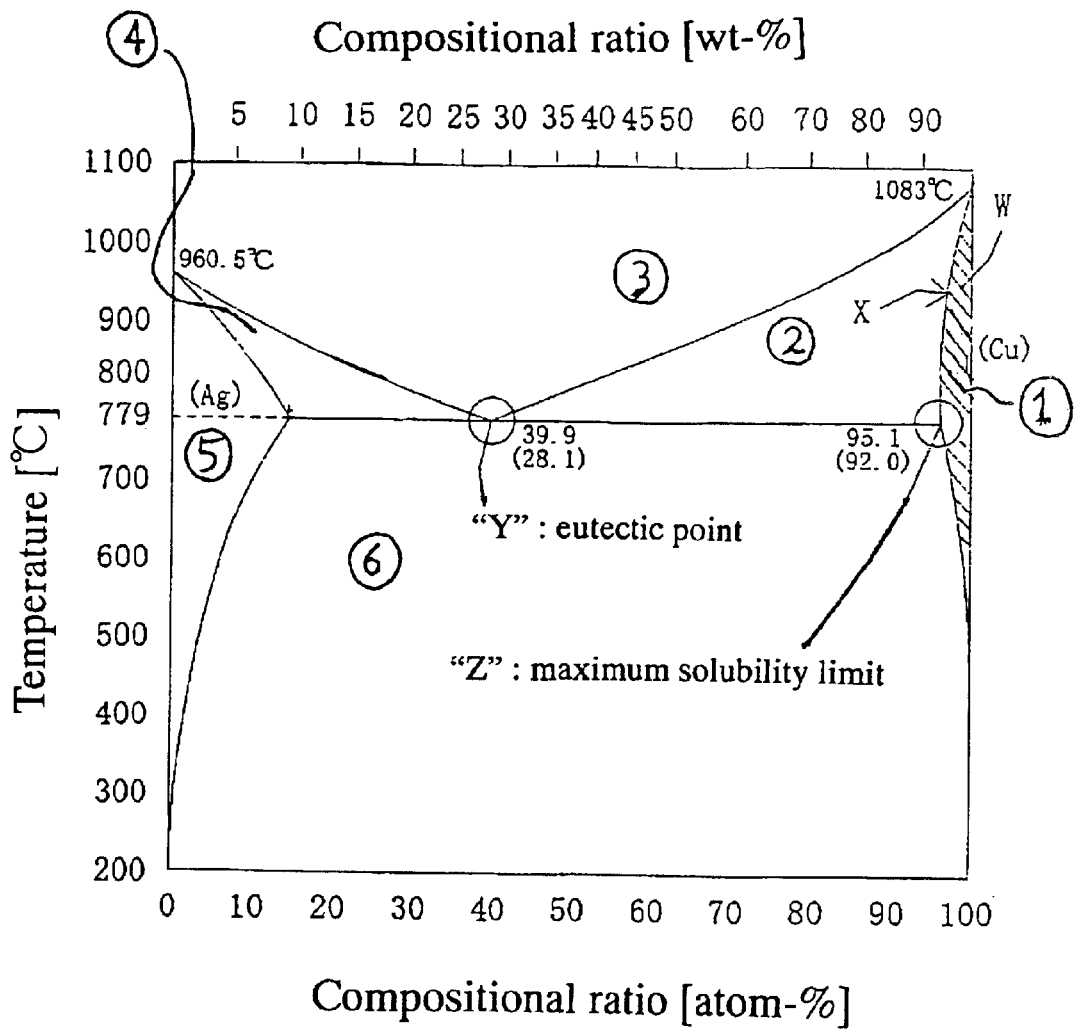
FIG. 4 is a phase diagram of Ag—Cu binary system.

FIG. 4 is a phase diagram of Ag—Cu binary system. A first area ① represents a solid phase of Cu. A second area ② represents co-existence of a liquid phase of Ag and Cu and a solid phase of Cu. A third area ③ represents a liquid phase of Ag and Cu. A fourth area ④ represents co-existence of a liquid phase of Ag and Cu and a solid phase of Ag. A fifth area ⑤ represents a solid phase of Ag. A sixth area ⑥ represents a solid phase of Ag and Cu. An eutectic point "Y" is 39.9 percents by weight of Ag to Cu. An eutectic temperature is 779° C. A maximum solubility limit "Z" is 4.9 percents by weight of Ag to Cu at the eutectic temperature is 779° C. A curved line "X" represents a solubility limit which vary depending upon temperature. The maximum point of solubility limit is the maximum solubility limit "Z".

As the amount of Ag added to Cu is increased, a temperature, at which a liquid phase is about to appear along the curved line "X", is dropped. The drop of the temperature, at which the liquid phase is about to appear, results in enlargement of the crystal grain size of the copper alloy. The copper alloy such as Ag—Cu having a small area of Cu solid phase area and a low eutectic temperature allows that an addition of Ag at a small amount efficiently drops the temperature, at which the liquid phase is about to appear. In the binary system such as Ag and Cu, the drop of the temperature, at which the liquid phase is about to appear, corresponds to the drop of the melting point. Namely, the addition of Ag to Cu efficiently drops the melting point. If Ag is added to Cu at a larger amount than the maximum solubility limit "Z", then Ag is partially precipitated without being allowed with Cu. The precipitation of Ag decreases a conductivity of the Ag—Cu alloy. In order to prevent the drop of the conductivity of the Ag—Cu alloy, it is preferable to add Ag to Cu at an amount of not more than the maximum solubility limit "Z". The drop of the melting point of the Ag—Cu alloy allows the growth of large crystal grains of the copper alloy. The enlargement of the crystal grain size of the copper alloy suppress the electromigration. The above descriptions are commonly applied to when in place of Ag, one of other elements such as Ag, As, Bi, P, Sb, Si, and Ti is added to Cu.

Figure 5A:
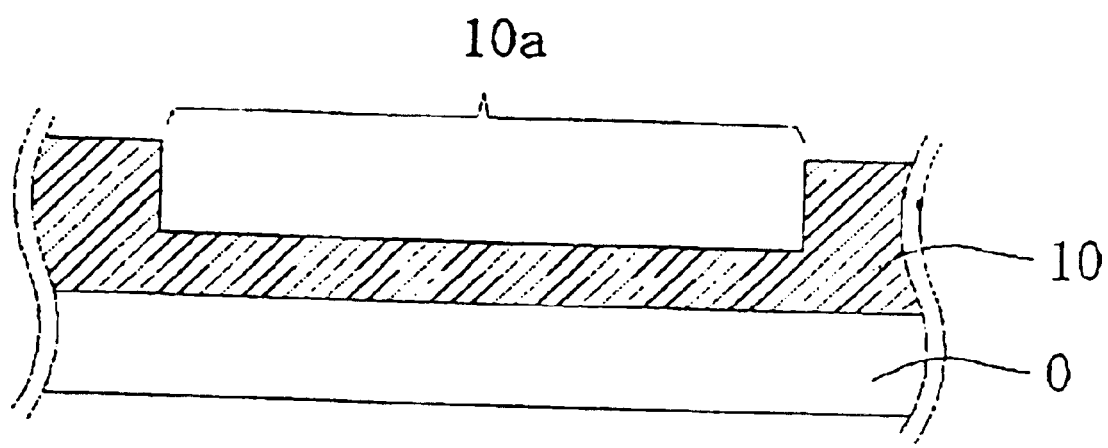
FIGS. 5A through 5E are fragmentary cross sectional elevation views illustrative of sequential steps involved in a novel method of forming a copper-alloy interconnection formed in a trench groove in an insulation film over a semiconductor substrate, taken along a plane vertical to a longitudinal direction of the copper-alloy interconnection in a first embodiment in accordance with the present invention.
Figure 5B:
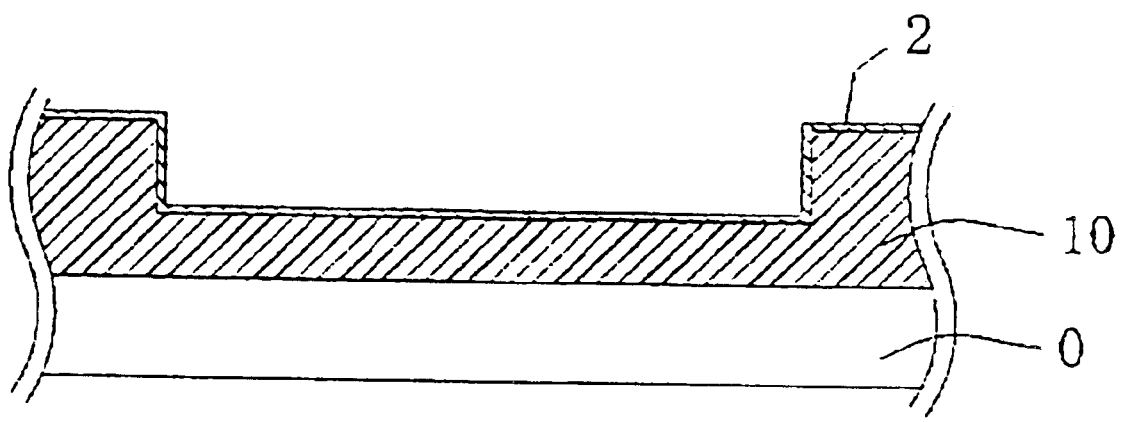

FIGS. 5A through 5E are fragmentary cross sectional elevation views illustrative of sequential steps involved in a novel method of forming a copper-alloy interconnection formed in a trench groove in an insulation film over a semiconductor substrate, taken along a plane vertical to a longitudinal direction of the copper-alloy interconnection in a first embodiment in accordance with the present invention With reference to FIG. 5A, a trench groove 10a is formed in an inter-layer insulator 10 to With reference to FIG. 5B, a barrier metal layer 2 is formed is entirely formed on a top surface of the inter-layer insulator 10 and on a bottom of side walls of the trench groove of the inter-layer insulator 10.

Figure 5C:
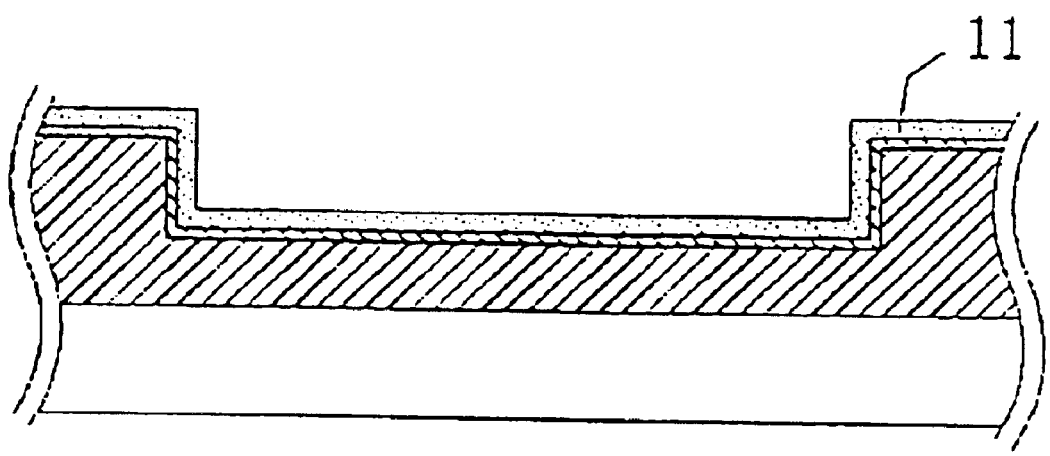

With reference to FIG. 5C, a seed layer 11 is formed on the barrier metal layer 2. The seed layer 11 comprises a copper alloy which includes at least one of Ag, As, Bi, P, Sb, Si, and Ti. An amount of at least one of Ag, As, Bi, P, Sb, Si, and Ti in the copper alloy is decided so that a final interconnection layer of copper alloy includes at least one of Ag, As, Bi, P, Sb, Si, and Ti in the range of not less than 0.1 percent by weight to not more than a maximum solubility limit to copper.

Figure 5D:
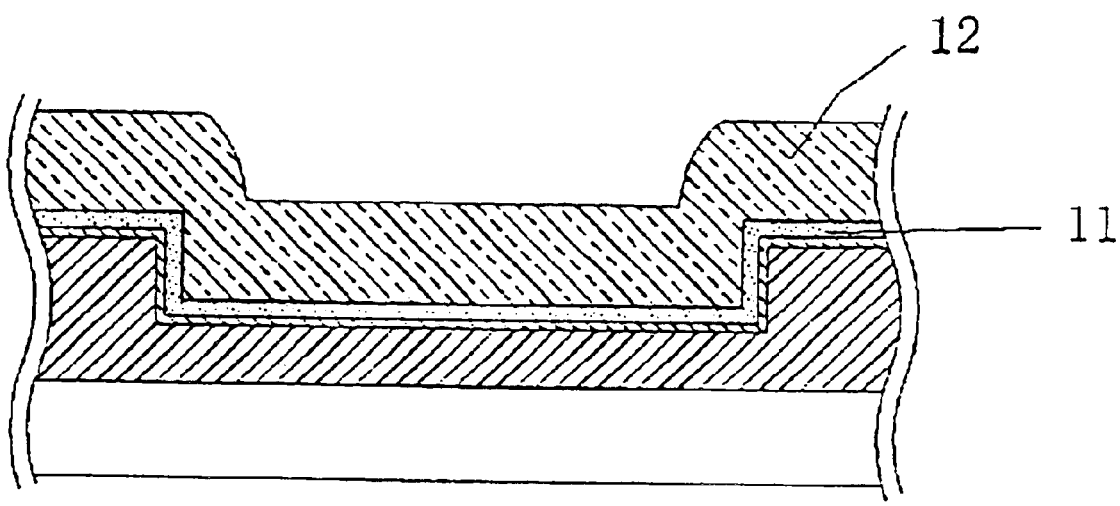

With reference to FIG. 5D, a copper layer 12 is further formed on the seed layer 11.

Figure 5E:
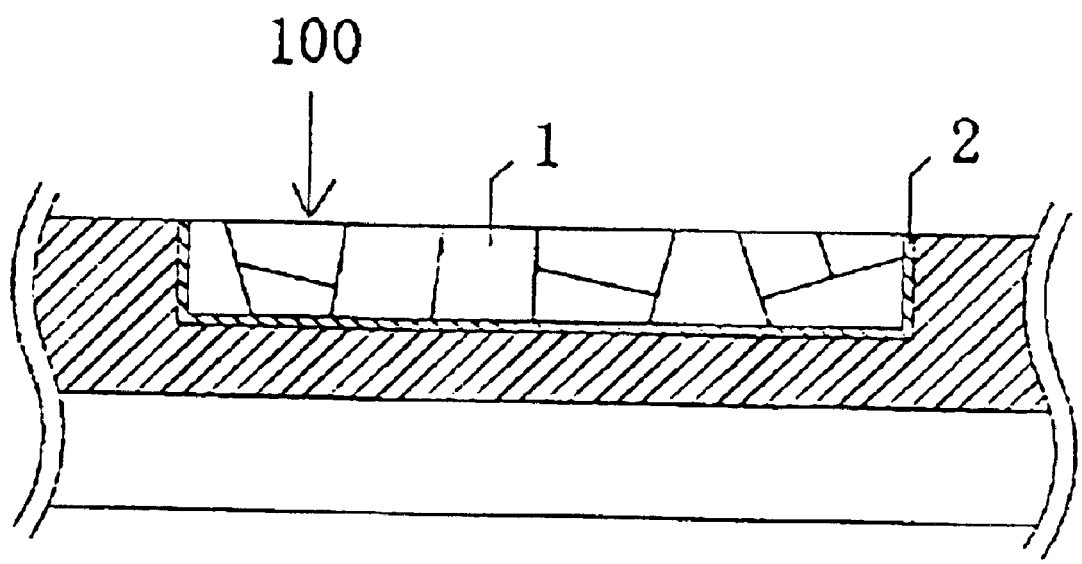

With reference to FIG. 5E, a chemical mechanical polishment is carried out to remove laminations of the copper layer 12, the seed layer 11, and the barrier metal layer 2 so that the laminations of the copper layer 12, the seed layer 11, and the barrier metal layer 2 remain only within the trench groove of the inter-layer insulator 10, whereby a top surface of the copper layer 12 is leveled to the top surface of the inter-layer insulator 12. A heat treatment is carried out to cause a thermal diffusion of at least one of Ag, As, Bi, P, Sb, Si, and Ti in the seed layer 11 to the copper layer 12, whereby a copper alloy interconnection layer 1 is formed on the barrier metal layer 2 and within the trench groove of the inter-layer insulator 10. The copper alloy interconnection layer 1 includes at least one of Ag, As, Bi, P, Sb, Si, and Ti in the range of not less than 0.1 percent by weight to not more than a maximum solubility limit to copper. The copper alloy interconnection layer 1 has large size crystal grains and a small number of the crystal grains. The grain boundaries exist across the longitudinal direction of the copper alloy interconnection layer 1.

Second Embodiment

Figure 6A:
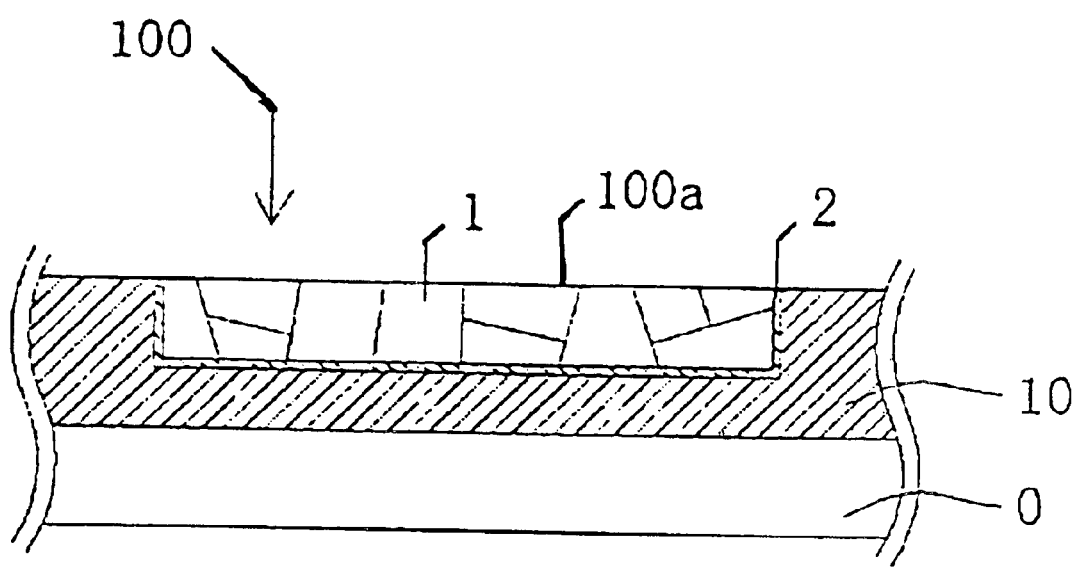
FIG. 6A is a fragmentary cross sectional elevation view illustrative of a novel copper-alloy interconnection formed in a trench groove in an insulation film over a semiconductor substrate, taken along a plane vertical to a longitudinal direction of the copper-alloy interconnection in a second embodiment in accordance with the present invention.
Figure 6B:
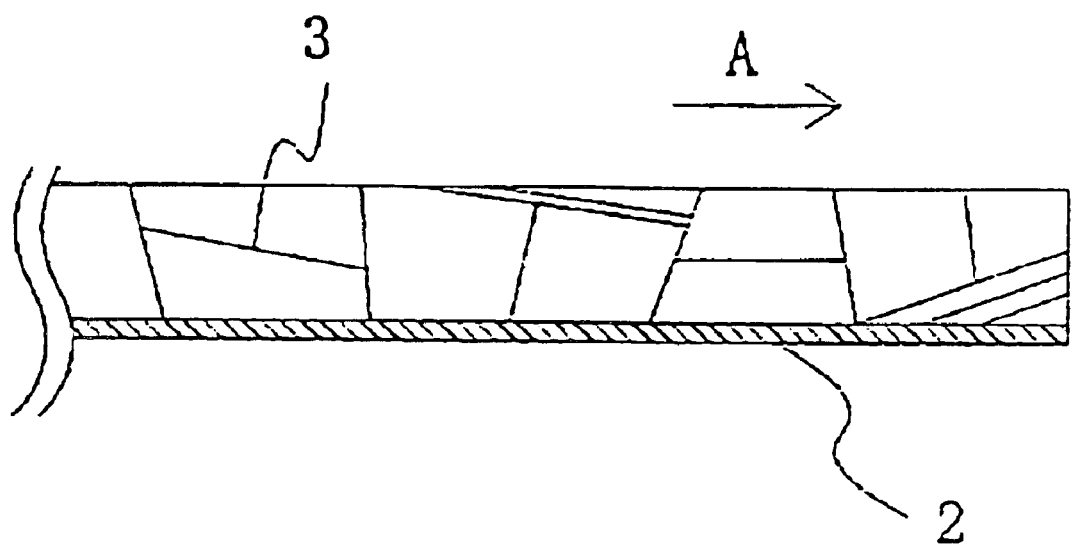
FIG. 6B is a partially enlarged view illustrative of the copper-alloy interconnection of FIG. 6A.
Figure 6C:
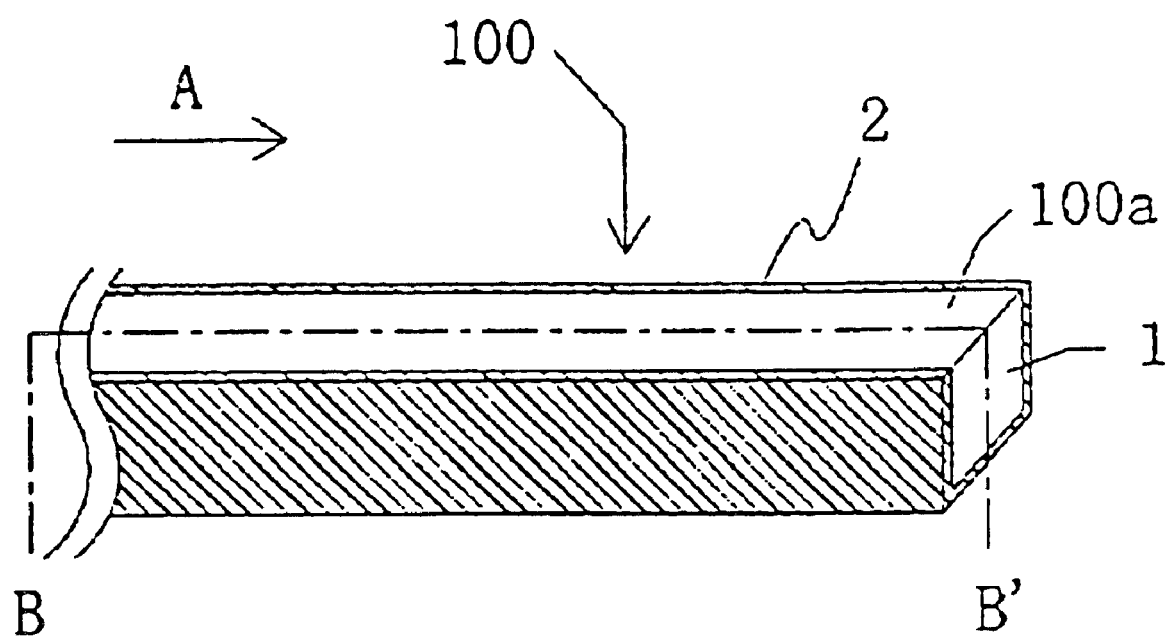
FIG. 6C is a fragmentary perspective view illustrative of the novel copper-alloy interconnection of FIG. 6A.
Figure 6D:
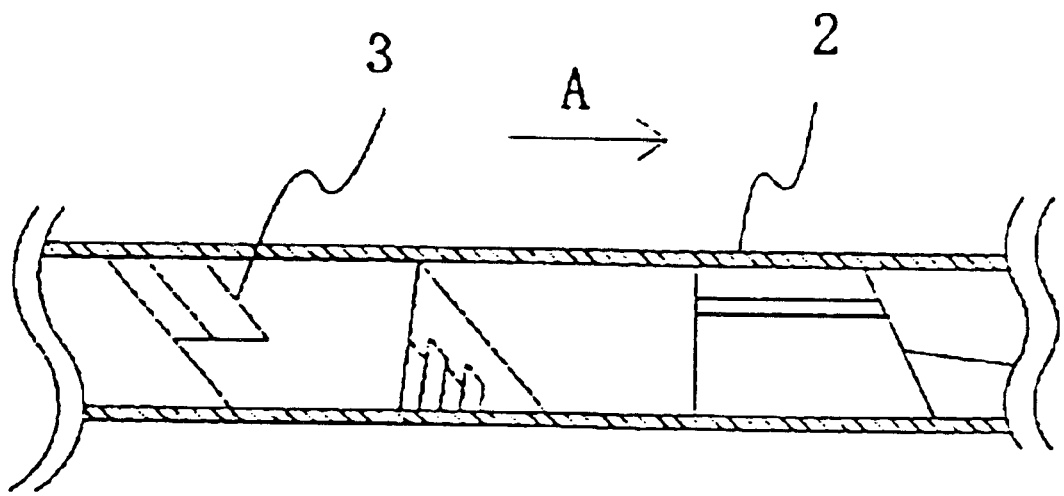
FIG. 6D is a fragmentary cross sectional elevation view illustrative of the novel copper-alloy interconnection, taken along a B-B' line of FIG. 6C, wherein the B-B" line is parallel to the longitudinal direction of the copper-alloy interconnection.

A second embodiment according to the present invention will be described in detail with reference to the drawings. FIG. 6A is a fragmentary cross sectional elevation view illustrative of a novel copper-alloy interconnection formed in a trench groove in an insulation film over a semiconductor substrate, taken along a plane vertical to a longitudinal direction of the copper-alloy interconnection in a second embodiment in accordance with the present invention. FIG. 6B is a partially enlarged view illustrative of the copper-alloy interconnection of FIG. 6A. FIG. 6C is a fragmentary perspective view illustrative of the novel copper-alloy interconnection of FIG. 6A. FIG. 6D is a fragmentary cross sectional elevation view illustrative of the novel copper-alloy interconnection, taken along a B-B' line of FIG. 6C, wherein the B-B' line is parallel to the longitudinal direction of the copper-alloy interconnection.

A copper-alloy interconnection is provided in an inter-layer insulator 10 provided on a semiconductor substrate 0. The inter-layer insulator 10 has a trench groove with a predetermined narrow width. A barrier metal layer 2 extends on a bottom and side walls of the trench groove of the inter-layer insulator 10. A copper-alloy interconnection 200 exists on the barrier metal layer, so that the copper-alloy interconnection 200 fills the trench groove of the inter-layer insulator 10. The copper-alloy interconnection 200 comprises laminations of the barrier layer 2 and a copper alloy interconnection layer 21 which includes at least one of Mo, Ta and W in a range of not less than 0.1 percent by weight to not more than a maximum solubility limit to copper, so that the copper alloy interconnection layer 21 is in a solid solution. The copper-alloy interconnection 200 has a top surface 200a leveled to a top surface of the inter-layer insulator 10.

The copper-alloy interconnection 200 exists within the trench groove in the inter-layer insulator 10. It is easy to accurately control the width of the trench groove in the inter-layer insulator 10. The means it easy to accurately control the width of the copper-alloy interconnection 200. This allows realization of the fine interconnection with the reduced width in order to realize the increased degree of integration of the semiconductor device.

The copper alloy interconnection layer 21 exists on the barrier metal layer 2 extending on the bottom and the side walls of the trench groove in the inter-layer insulator 10. The barrier metal layer 2 increases an adhesiveness of the copper alloy interconnection layer 21 to the inter-layer insulator 10. Further, the barrier metal layer 2 prevents a diffusion of copper atoms in the copper alloy interconnection layer 21 to the inter-layer insulator 10.

At least one of Mo, Ta and W is included in the copper alloy in a range of not less than 0.1 percent by weight to not more than 1 percent by weight. Each of Mo, Ta and W exists on the copper crystal grain boundaries 23 and/or within the copper crystal grains. Mo, Ta and W are larger in density than Cu. Thus, Mo, Ta and W are lower in mobility through the copper alloy than Cu. Mo, Ta and W are likely to be precipitated on the crystal grain boundaries 24 to suppress diffusion of copper. Namely, Mo, Ta and W suppress the mass-transfer of copper through the copper alloy. Resistivity of each of Mo, Ta and W is not more than ten times of a copper resistivity. The inclusion of at least one of Mo, Ta and W suppress the mass-transfer or diffusion of copper through the copper alloy without any excessive increase in resistivity of the copper alloy. The suppression of the mass-transfer or diffusion of copper through the copper alloy suppresses electromigration in the interconnection 200 or reduces the probability of generation of electromigration. The suppression to electromigration in the interconnection 200 or the reduction in the probability of generation of electromigration reduces the probability of disconnection and crack of the interconnection 200. The reduction in the probability of disconnection and crack of the interconnection 200 improves the reliability and the productivity of a semiconductor device having the interconnection 200.

If, contrary to the present invention, at least one of Mo, Ta and W is included in the copper alloy at more than 1 percent by weight, then the resistivity of the copper alloy is too high, and the resistance of the interconnection 200 is too high.

If, contrary to the present invention, at least one of Mo, Ta and W is included in the copper alloy at less than 0.1 percent by weight, the effect of suppressing the mass-transfer of copper through the copper alloy is insufficient, resulting in insufficient effect of suppression to the mass-transfer or diffusion of copper through the copper alloy. The effect of suppressing electromigration in the interconnection 200 or reducing the probability of generation of electromigration is insufficient. The insufficient effect of suppression to electromigration in the interconnection 200 or further reduction in the probability of generation of electromigration results in an insufficient reduction in probability of disconnection and crack of the interconnection 200. The insufficient reduction in the probability of disconnection and crack of the interconnection 200 results in insufficient improvement in the reliability and the productivity of a semiconductor device having the interconnection 200.

Whereas modifications of the present invention will be apparent to a person having ordinary skill in the art, to which the invention pertains, it is to be understood that embodiments as shown and described by way of illustration are by no means intended to be considered in a limiting sense. Accordingly, it is to be intended to cover by claims all modifications which fall within the spirit and scope of the present invention.

What is claimed is:

1. An electrically conductive layer, comprising:
   a copper alloy interconnection layer which fills a trench grove and includes a copper alloy comprising at least one of Ag, As, Bi, and Sb at not less than 0.1 percent by weight, so as to increase a crystal grain size and reduce crystal grain boundaries,
     wherein said copper alloy further includes at least one of Mo, Ta and W in a range of not less than 0.1 percent by weight to not more than 1 percent by weight, and
     wherein said at least one of Mo, Ta and W being higher in density than copper is present on said crystal grain boundaries, whereby said at least one of Mo, Ta and W suppresses a diffusion of copper.

2. The electrically conductive layer as claimed in claim 1, wherein said at least one of Ag, As, Bi, and Sb is included in said copper alloy in a range of not less than 0.1 percent by weight to not more than a maximum solubility limit to copper, so that said copper alloy is in a solid solution.

3. The electrically conductive layer as claimed in claim 2, wherein said copper alloy further includes at least one of Cr and Ni in a range of not less than 0.1 percent by weight to not more than 1 percent by weight.

4. The electrically conductive layer as claimed in claim 2, wherein said copper alloy further includes at least one of Ge and Mg in a range of not less than 0.1 percent by weight to not more than a maximum solubility limit of copper.

5. The electrically conductive layer as claimed in claim 4, wherein said copper alloy further includes at least one of Cr and Ni in range of not less than 0.1 percent by weight to not more than 1 percent by weight.

6. The electrically conductive layer as claimed in claim 1, wherein said interconnection layer exists on a barrier metal layer extending on a bottom and side walls of said groove.

7. The electrically conductive layer according to claim 1, wherein said crystal grain boundaries exist along a longitudinal direction of said interconnection layer.

8. The electrically conductive layer according to claim 1, wherein said copper alloy interconnection layer comprises a top surface leveled to a top surface of an insulation layer.

9. An electrically conductive layer, comprising:
   a copper alloy interconnection layer which fills a trench groove and includes a copper alloy comprising at least one of Mo, Ta and W in a range of not less than 0.1 percent by weight to not more than 1 percent by weight, wherein the mass-transfer of copper is suppressed through said copper alloy,
     wherein said copper alloy further includes at least one of Ag, As, Bi, and Sb in a range of not less than 0.1 percent by weight to not more than a maximum solubility limit of copper, so as to increase a crystal grain size and reduce crystal grain boundaries,
     wherein said copper alloy further includes at least one of Ge and Mg in a range of not less than 0.1 percent by weight to not more than a maximum solubility limit of copper, and
     wherein said at least one of Mo, Ta and W being higher in density than copper is present on said crystal grain boundaries, whereby said at least one of Mo, Ta and W suppresses a diffusion of copper.

10. The electrically conductive layer as claimed in claim 9, wherein said copper alloy further includes at least one of Cr and Ni in a range of not less than 0.1 percent by weight to not more than 1 percent by weight.

11. The electrically conductive layer as claimed in claim 9, wherein said copper alloy interconnection layer fills said trench groove, which is formed in an insulation layer.

12. The electrically conductive layer as claimed in claim 11, further comprising:
   a barrier metal layer extending on a bottom and side walls of said trench groove, said copper alloy interconnection layer being formed on said barrier metal layer.

13. The electrically conductive layer according to claim 9, wherein said copper alloy interconnection layer comprises a top surface leveled to a top surface of an insulation layer.

14. A semiconductor device, comprising:
   a semiconductor substrate;
   an insulation layer over said semiconductor substrate, and said insulation layer having a trench groove;
   a barrier metal layer on a bottom and side walls of said trench groove; and
   an interconnection layer formed on said barrier metal layer, and
     comprising a copper alloy which fills said trench groove and includes at least one of Ag, As, Bi, and Sb in a range of not less than 0.1 percent by weight to not more than a maximum solubility limit of copper, so that said copper alloy is in a solid solution, so as to increase a crystal grain size and reduce crystal grain boundaries,
     wherein said copper alloy includes at least one of Mo, Ta and W in a range of not less than 0.1 percent by weight to not more than 1 percent by weight, and wherein said at least one of Mo, Ta and W being higher in density than copper is present on said crystal grain boundaries, whereby said at least one of Mo, Ta and W suppresses a diffusion of copper.

15. The semiconductor device as claimed in claim 14, wherein said copper alloy further includes at least one of Cr and Ni in a range of not less than 0.1 percent by weight to not more than 1 percent by weight.

16. The semiconductor device according to claim 14, wherein said interconnection layer comprises a top surface leveled to a top surface of said insulation layer.

17. A semiconductor device, comprising:
a semiconductor substrate;
an insulation layer over said semiconductor substrate, and said insulation layer having a groove;
a barrier metal layer on a bottom and side walls of said groove; and
an interconnection layer formed on said barrier metal layer
and comprising a copper alloy which fills said groove and includes at least one of Mo, Ta and W in a range of not less than 0.1 percent by weight to not more than 1 percent by weight,
wherein said copper alloy further includes at least one of Ag, As, Bi, and Sb in a range of not less than 0.1 percent by weight to not more than a maximum solubility limit of copper, so that said copper alloy is in a solid solution, so as to increase a crystal grain size and reduce crystal grain boundaries, and
wherein said at least one of Mo, Ta and W being higher in density than copper is present on said crystal grain boundaries, whereby said at least one of Mo, Ta and W suppresses a diffusion of copper.

18. The semiconductor device as claimed in claim 17, wherein said copper alloy further includes at least one Ge and Mg in a range of not less than 0.1 percent by weigh to not more than a maximum solubility limit of copper.

19. The semiconductor device as claimed in claim 17, wherein said copper alloy further includes at least one of Cr and Ni in a range of not less than 0.1 percent by weight to not more than 1 percent by weight.

20. The semiconductor device according to claim 17, wherein said interconnection layer comprises a top surface leveled to a top surface of said insulation layer.

21. The semiconductor device according to claim 17, wherein said interconnection layer is situated within said trench groove.

22. An electrically conductive layer, comprising:
a copper alloy interconnection layer which fills a trench groove and includes a copper alloy comprising at least one of As, Bi, and Sb at not less than 0.1 percent by weight, so as to increase a crystal grain size and reduce crystal grain boundaries,
wherein said copper alloy further includes at least one of Mo, Ta and W in a range of not less than 0.1 percent by weight to not more than 1 percent by weight, and
wherein said at least one of Mo, Ta and W being higher in density than copper is present on said crystal grain boundaries, whereby said at least one of Mo, Ta and W suppresses a diffusion of copper.

23. An electrically conductive layer, comprising:
a copper alloy interconnection layer which fills a trench groove and includes a copper alloy comprising at least one of Bi and Sb at not less than 0.1 percent by weight, so as to increase a crystal grain size and reduce crystal grain boundaries,
wherein said copper alloy further includes at least one of Mo, Ta and W in a range of not less than 0.1 percent by weight to not more than 1 percent by weight, and
wherein said at least one of Mo, Ta and W being higher in density than copper is present on said crystal grain boundaries, whereby said at least one of Mo, Ta and W suppresses a diffusion of copper.

24. An electrically conductive layer, comprising:
a copper alloy interconnection layer which fills a trench groove and includes a copper alloy comprising Bi at not less than 0.1 percent by weight, so as to increase a crystal grain size and reduce crystal grain boundaries,
wherein said copper alloy further includes at least one of Mo, Ta and W in a range of not less than 0.1 percent by weight to not more than 1 percent by weight, and
wherein said at least one of Mo, Ta and W being higher in density than copper is present on said crystal grain boundaries, whereby said at least one of Mo, Ta and W suppresses a diffusion of copper.

* * * * *